US009574541B2

(12) United States Patent
Ghosh et al.

(10) Patent No.: US 9,574,541 B2
(45) Date of Patent: Feb. 21, 2017

(54) COMPACT LASER IGNITION DEVICE FOR COMBUSTION ENGINE

(71) Applicant: Princeton Optronics Inc., Mercerville, NJ (US)

(72) Inventors: Chuni L Ghosh, West Windsor, NJ (US); Qing Wang, Plainsboro, NJ (US); Bing Xu, Bayside, NY (US); Robert van Leeuwen, Ewing, NJ (US)

(73) Assignee: PRINCETON OPTRONICS INC., Mercerville, NJ (US)

( * ) Notice: Subject to any disclaimer, the term of this patent is extended or adjusted under 35 U.S.C. 154(b) by 0 days.

(21) Appl. No.: 15/166,296

(22) Filed: May 27, 2016

(65) Prior Publication Data

US 2016/0348636 A1 Dec. 1, 2016

Related U.S. Application Data

(60) Provisional application No. 62/166,749, filed on May 27, 2015.

(51) Int. Cl.
*F02P 23/00* (2006.01)
*F02P 23/04* (2006.01)

(52) U.S. Cl.
CPC .................... *F02P 23/04* (2013.01)

(58) Field of Classification Search
CPC ........................................... F02P 23/04
USPC .......................... 123/143 B, 41.32
See application file for complete search history.

(56) References Cited

U.S. PATENT DOCUMENTS

| 7,806,094 | B2 | 10/2010 | Gruber |
| 8,127,732 | B2 | 3/2012 | Kopecek et al. |
| 8,312,854 | B2 | 11/2012 | Weinrotter et al. |
| 8,322,320 | B2 | 12/2012 | Oledzki |
| 8,616,006 | B2 | 12/2013 | Rocci Denis et al. |
| 8,939,120 | B1 | 1/2015 | Meneguzzi et al. |
| 9,212,648 | B2 * | 12/2015 | Gruber |
| 9,316,200 | B2 * | 4/2016 | Woerner ................ F02P 23/04 |

(Continued)

OTHER PUBLICATIONS

Qing Wang and Robert van Leeuwen, "6-Cyl Natural Gas Engine Operation Iginted by micro Lasers", LIC 8-2, Presented at Laser Ignition Conference, Yokohama, Japan, May 18-20, 2016.

(Continued)

*Primary Examiner* — Thomas Moulis

(57) ABSTRACT

A high efficiency optical ignition device is provided in a two-part compact and robust package to be mounted directly on an internal combustion engine chamber. The ignition device ignites a combustion fuel with a high intensity plasma generated by a high power laser beam from a solid state laser operable in Q-switched, or non-Q-switched mode for producing short or long pulses, respectively. Multiple pulses are generated, and duration and frequency of the laser beam pulses are controlled by controlling an optical pump module to pump the solid state laser. The optical pump module comprises a semiconductor laser, preferably a VCSEL device. One or more laser beams are precisely directed, each one to a desired location anywhere within the combustion chamber for more efficient and near complete burning of the combustion fuel. The robust packaging is well suited to withstand mechanical and thermal stresses of the internal combustion engine.

20 Claims, 16 Drawing Sheets

(56) References Cited

U.S. PATENT DOCUMENTS

| | | | |
|---|---|---|---|
| 2007/0064746 A1* | 3/2007 | Winklhofer | F02P 23/04 372/10 |
| 2009/0133655 A1 | 5/2009 | Inohara et al. | |
| 2010/0282196 A1* | 11/2010 | Ridderbusch | F02P 23/04 123/143 B |
| 2013/0014717 A1 | 1/2013 | Moenster et al. | |
| 2013/0112164 A1 | 5/2013 | Morishima et al. | |
| 2013/0199483 A1 | 8/2013 | Herden et al. | |
| 2013/0206091 A1 | 8/2013 | Kanehara et al. | |
| 2013/0255613 A1 | 10/2013 | Hartke et al. | |
| 2013/0276738 A1 | 10/2013 | Hartke | |
| 2013/0291818 A1 | 11/2013 | Hartke et al. | |
| 2013/0340696 A1 | 12/2013 | Woerner et al. | |
| 2014/0041612 A1 | 2/2014 | Furutani et al. | |
| 2014/0109855 A1 | 4/2014 | Gruber | |
| 2014/0216383 A1* | 8/2014 | Nuebel | F01P 3/16 123/143 B |
| 2014/0238038 A1 | 8/2014 | Macchia et al. | |
| 2014/0265810 A1* | 9/2014 | Livesay | F21V 29/006 313/12 |
| 2014/0290613 A1* | 10/2014 | Gruber | F01P 1/06 123/143 B |
| 2015/0136049 A1* | 5/2015 | Stoppel | F01P 3/16 123/41.32 |

OTHER PUBLICATIONS

E. Wintner et al., "Laser Ignition of Engines-A Contribution to Environmental Protection and a Challenge to Laser technology", Annual Journal of Electronics, 2014, pp. 1-8.

E. Wintner et al., "Laser Plasma Ignition: Status, Perspective, Solutions", Fundamentals of Laser Assited Micro- and Nanotechnologies 2013, Ed. V.P. Veiko, T.A. Vartanyan, Peoc. of SPIE vol. 9065, pp. 90650B-1-90650B-12.

\* cited by examiner

COMPACT LASER IGNITION DEVICE FOR COMBUSTION ENGINE

CROSS REFERENCE TO RELATED APPLICATION

The present application seeks priority from the U.S. Provisional Patent Application No. 62/166,749 filed on May 27, 2015, the content of which application is being incorporated by reference in its entirety.

BACKGROUND OF THE INVENTION

Field of Invention

This invention relates to controlled ignition of combustible fluid materials or fluid mixtures in a closed environment, and in particular to a laser ignition device for an internal combustion engine constructed from high power high brightness semiconductor lasers including VCSEL devices, and is suited to be operable under high mechanical, vibrational and thermal stress.

Related Background Art

Ignition of a combustible fluid or a combustible fluid mixture such as, gasoline and air, etc. (combustion fuel hereinafter) in an internal combustion engine using conventional electrical spark plugs, is inefficient and therefore uses more fuel and generates more emission gases that cause pollution. A major advantage of improving combustion efficiency would result in using leaner combustion mixture (having a low fuel/air ratio) to support nearly complete combustion which would thereby facilitate fuel efficiency and lower environmental cost. While a lot of research and resource is directed towards improving combustion efficiency, none has proven better than using an ignition device and a process that will allow use of a leaner combustion mixture and ignition at higher pressure.

The concept of using a high intensity light source for reliable and efficient combustion as compared to using a conventional electrical spark plug has been described in the U.S. Pat. No. 3,861,371 issued on Jan. 21, 1975 to Gamell. The light source in this approach is a high intensity broad band light source, such as a high intensity flash lamp or a strobe light. As the technology progressed, the high intensity light source was replaced by a laser source, typically a solid state laser, for example a ruby or a Nd:YAG laser. However, to achieve high enough output power using traditional optical pumping schemes require a very large pumping source and cooling device. In recent years, different innovative concepts have been applied to facilitate a better ignition device and a better combustion process to facilitate a near complete combustion of the fuel mixture.

These innovative concepts include using optical fiber to deliver a continuous wave (CW) or pulsed laser radiation to the combustion chamber, high energy Q-switched pulsed laser operation, ricocheting the laser beam in the combustion chamber by positioning reflecting surface within the ignition chamber, using a plurality of CW or pulsed laser beam to focus at different regions of the combustion chamber to ignite the combustion fuel in different regions. as has been described in many patent and non-patent literature publications (U.S. Pat. No. 4,314,530 issued on Feb. 9, 1982, to Giacchetti, U.S. Pat. No. 4,416,226 issued on Nov. 22, 1983 to Nishida et al., United States Patent Application Publication No. 20140238038 published on Aug. 28, 2014, by Macchia et al.).

A wide range of laser devices including solid state lasers, edge and surface emitting semiconductor lasers are used to construct ignition devices. The laser light is directly launched in the combustion chamber through a suitable transparent window that seals the laser apparatus from the combustion chamber and thereby impervious to the combustion process. In addition, one or more optical elements are used to achieve a desired beam profile and quality so as to deliver high energy laser pulses directly in to the combustion chamber through the window. Therefore, it is extremely important to incorporate a device for example a pre-chamber for generating a high temperature plasma or/and a method, to keep the window clean of combustion fluid mixture or residue from the combustion process to minimize attenuation of the laser light during operation of the engine as has been described in the U.S. Pat. No. 7,806,094 issued on Oct. 5, 2010 to Gruber.

One important requirement for reliable operation of an optical ignition device is optical beam quality and optical power to efficiently burn a combustion mixture, and mechanical and thermal robustness to survive mechanical, vibrational and thermal stress of an internal combustion engine environment. In addition, it is desirable to have a form factor that closely matches the form factor of a conventionally used electrical spark plug. An ignition device using VCSELs as ignition source is described in the United States Patent Application Publication No. 20130291818 published on Nov. 7, 2013, by Hartke et al. There it describes a laser spark plug which uses a plurality of VCSELs to generate multiple beams that are focused using optical components to ignite combustion fluid mixture (vapor) at plurality of regions in an internal combustion engine.

A more widely used configuration of laser ignition device includes an optically pumped solid state laser medium. Optical pumps include semiconductor lasers for example, edge emitting or surface emitting lasers including VCSEL or arrays of semiconductor lasers. Due to the small size as well as superior emission properties of VCSELs or VCSEL arrays, laser ignition devices in a small form factor external housing may be installed using a threaded section to an external wall of a combustion chamber similar to a conventional electric spark plug (United States Patent Application Publication No. 20140109855 published on Apr. 24, 2014, by Gruber, United States Patent Application Publication No. 20140216383 published on Aug. 7, 2014, by Nuebel et al., United States Patent Application Publication No. 20130276738 published on Oct. 24, 2913 by Hartke).

Small form factor optical pumps using semiconductor edge emitting lasers or VCSELs are also suitable for pumping solid-state laser in Q-switched mode. Optical pumps may be implemented in end-on as well as side-pumping configurations within a small mechanical housing (U.S. Pat. No. 8,576,885 issued on Nov. 5, 2013, to van Leeuwen et al., United States Patent Application Publication No. 20130255613 published on Oct. 3, 2013, by Hartke et al., United States Patent Application Publication No. 20140290613 published on Oct. 3, 2013, by Hartke et al., United States Patent Application Publication No. 20130199483 published on Aug. 8, 2013 by Herden et al., United States Patent Application Publication No. 20090133655 published on May 28, 2009, by Inohara et al., U.S. Pat. No. 8,322,320 issued on Dec. 4, 2012, to Oledzki, U.S. Pat. No. 6,382,957 issued on May 7, 2002, to Early et al.).

Most of the prior art laser ignition device use either a remote (using a fiber) or an integrated optical pump assembled in a cylindrical housing. In one prior art design the optical ignition is equipped with a spring loaded housing for a vibration free operation (U.S. Pat. No. 8,312,854 issued on Nov. 20, 2012 to Weinrotter et al.). Other design aspects include components for fixed or variable focusing optics such as lens or microlens array, beam guiding devices, window including sapphire window, coupling devices, polarization selective output option, apparatus to generate a plurality of individually addressable beams, an antechamber construction to pre-ignite the combustion fuel and introduce the hot plasma at many different locations of the internal combustion chamber, and provision for air or liquid cooled apparatus with heat exchanger for cooling the optical pump as well as the solid state laser material.

Despite all the progress made in innovative designs for laser ignition devices or optical spark plugs, there is still a need for an optical spark plug that would easily adapt to, and conform to the widely used electric spark plug with added advantage of ultra-compact small form factor, higher combustion efficiency, longer life cycle and lower environmental cost. In this invention a compact laser ignition device is provided. The apparatus as designed includes a solid state ignition laser, an optical pump source, beam shaping and steering optics in a robust and compact housing that may even be smaller than 3.0" in length and about 0.75" in diameter. The device as claimed functions for combustion of fluids or fluid mixtures including gasoline, and natural gas.

BRIEF SUMMARY OF THE INVENTION

A compact laser ignition device provided in this invention including a solid state ignition laser, an optical pump source, and beam shaping and steering optics in a robust and compact packaging that may even be less than 3" in length and about 0.75" diameter, is a direct replacement for the traditional electrical spark plug. The laser ignition device constructed according to this invention operated stably in the harsh thermal, mechanical and vibrational environment of a combustion chamber. In a trial experiment combustion efficiency using the laser ignition device according to this invention was more than 25% as compared to a conventional electric spark plug. The results are published in the Laser Ignition Conference, May 18-20, 2016, in Yokohama, Japan, by some of the inventors of this application ("6-Cylinder Natural Gas Engine Operation By μLasers").

A high efficiency optical ignition device is provided in a two-part compact and robust package to be mounted directly on an internal combustion engine chamber. The ignition device ignites a combustion fuel including but not limited to, gasoline and natural gas, with a high intensity plasma generated by a high power laser beam from a solid state laser (ignition laser) operable in Q-switched, or non-Q-switched mode for producing high intensity short or long pulses, respectively. The robust packaging is well suited to withstand mechanical, vibrational and thermal stresses of the internal combustion engine.

In one aspect of the invention a solid gain medium in the ignition laser resonant cavity includes a passive Q-switching element to generate a laser output pulse with very high peak power to produce an ignition plasma. In an alternative embodiment the gain medium is configured without the Q-switching element to generate longer output pulses.

In alternate embodiments, the gain medium of the solid state laser is optically pumped with an optical pump module from one end, or from one or more sides along the length of the gain medium in end-pumping or side-pumping modes, respectively. In one aspect of the invention the optical pump module is operated in pulsed mode. As a consequence, intensity, duration and interval of output pulses from the ignition laser is determined by the operating mode of the optical pump module.

In one preferred embodiment, the optical pump module comprises one or more semiconductor lasers and more preferably, a VCSEL device. The optical pump module preferably comprising a VCSEL array device is operated by applying current pulses at a very high repetition rate and/or of very short duration. Multiple current pulses are applied to the pump module to generate multiple output pulses from the ignition laser.

In one variant aspect, multiple output pulses from the ignition laser are generated;

intensity, duration and interval of the output pulses are controlled by controlling parameters of the current pulse applied to the optical pump module and by exact configuration of the solid-state laser resonant cavity.

In a different aspect multiple output pulses are generated by applying a long current pulse from the pump module to the solid state laser with Q-switching. The continuing long pulse from the pump module regenerates gain in the medium after each Q-switched pulse, thereby generating multiple Q-switched pulses.

In another aspect of the invention multiple parallel output beams are simultaneously generated by separately pumping a different region of the gain medium, in effect having separate resonant cavities within a large size gain medium. In a variant aspect the gain medium comprises a plurality of gain media that individually operate as separate laser cavities.

In one aspect of the invention additional optical elements are used for beam shaping and beam steering. For example, in one embodiment, a microlens array is used to increase the brightness of the optical pump beam to facilitate pumping of the solid state laser more efficiently. In another related aspect of the invention additional optical elements are used to precisely direct one or more laser output beams, each one to a desired location anywhere within the combustion chamber for more efficient and near complete combustion process.

In one aspect of the invention additional structural features are provided to implement other functions. For example, a baffle is attached at the lower end of the ignition device to prevent combustion products from the combustion chamber to deposit on the window separating the optical parts from the combustion chamber. In another embodiment the laser output is focused to ignite combustion fuel in a pre-combustion chamber and the plasma generated is coupled to the ignite a larger volume of the combustion fuel including but not limited to gasoline, gasoline-air mixture, and natural gas fuels in the ignition chamber more uniformly.

In a different embodiment the ignition device is provided with cooling apparatus for stable operation of the pump module and ignition laser. The cooling apparatus may provide cooling by air convention through cooling fins or by a circulating liquid in a manifold. Additional cooling is achieved by attaching a fan for circulating air through the fins and through a thermo electric cooler. In one variant aspect a cooling liquid capable of phase transformation is used to achieve more effective cooling.

BRIEF DESCRIPTION OF THE DRAWINGS

The drawing figures that accompany this specification is a part of the specification and illustrate one or more embodiments of the present invention. While each embodiment shown in drawing figures highlights individual aspects, it is not to be construed as limiting. The embodiments of the invention will be more clearly understood when the following detailed description is read in conjunction with the accompanying drawing figures in which.

DETAILED DESCRIPTION

Fin and Fan Cooled Laser Ignition Device:

Various aspects of the laser ignition device (or ignition device hereinafter) will be described in different embodiments. These embodiments may be practiced as is, or aspects from different embodiments may be adapted in combinations and sub-combinations to suit a particular application or to satisfy other requirement for example, size of the ignition device, physical and mechanical design, optical power, size of the combustion chamber, and number of locations ignition is to be initiated for more uniform combustion of a fuel/fuel air mixture, etc. In general, it is preferable to adapt a form factor that is compatible with conventionally used electrical spark plug and easily mounted to the combustion chamber wall.

Figure 1:
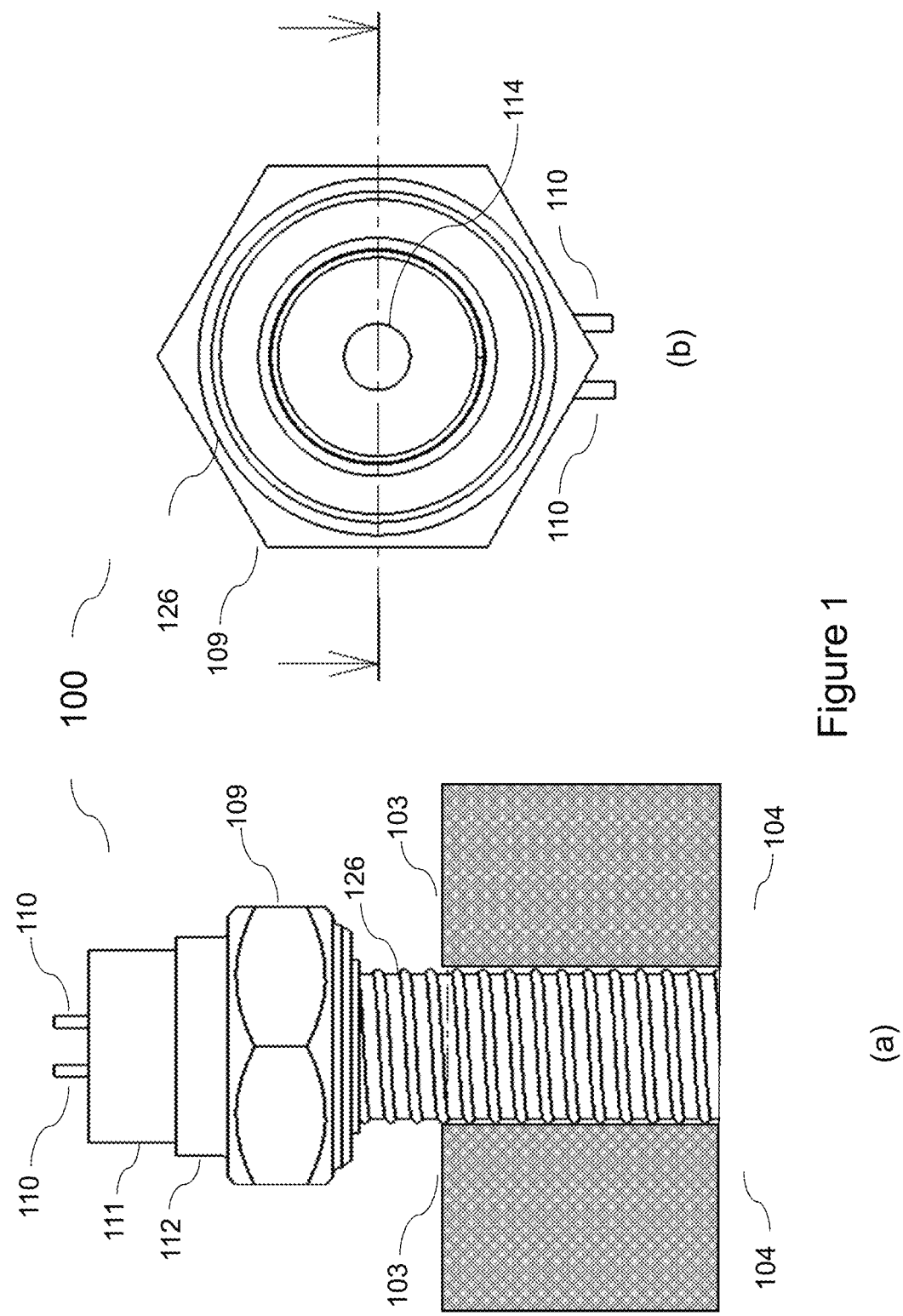
FIG. 1 is a schematic drawing of a laser ignition device; a) perspective view, and b) projection view from the side of an ignition chamber.

FIG. 1 shows a mechanical drawing of an ignition device. Similar physical structure is also adapted in many prior art laser ignition devices that are often referred to as optical spark plug. More specifically, FIG. 1a schematically shows a perspective view of exterior of an ignition device that may be mounted on an outer wall 103 of a combustion chamber 104 where the fuel/fuel air mixture including but not limited to, gasoline, gasoline-air mixture, natural gas etc. is ignited. In general, the ignition device includes an elongated housing including on the exterior, a nut 109 and a threaded section 126 that is attached to a threaded cavity in the outer wall of the combustion chamber, in substantially similar manner as an electrical spark plug. Other mechanical means, such as a spring, clip, etc. are not precluded.

The housing also includes a thermally conducting support 112 (heat sink) for heat transfer and an insulated section 111 to isolate electrical connections 110 (only two shown). FIG. 1b schematically shows a cross section view seen from the lower threaded end of the elongated housing (in reference with the nut 109 and the threaded outer wall 126). The lower section includes a transparent window 114 facing the combustion chamber; the window separates internal components of the ignition device from the combustion chamber. In general, the interior of the elongated housing is hollow to enclose a solid state laser (ignition laser), an optical pump module and one or more additional optical components for beam shaping and beam steering to focus and direct the laser beam to inside of the combustion chamber.

Figure 2:
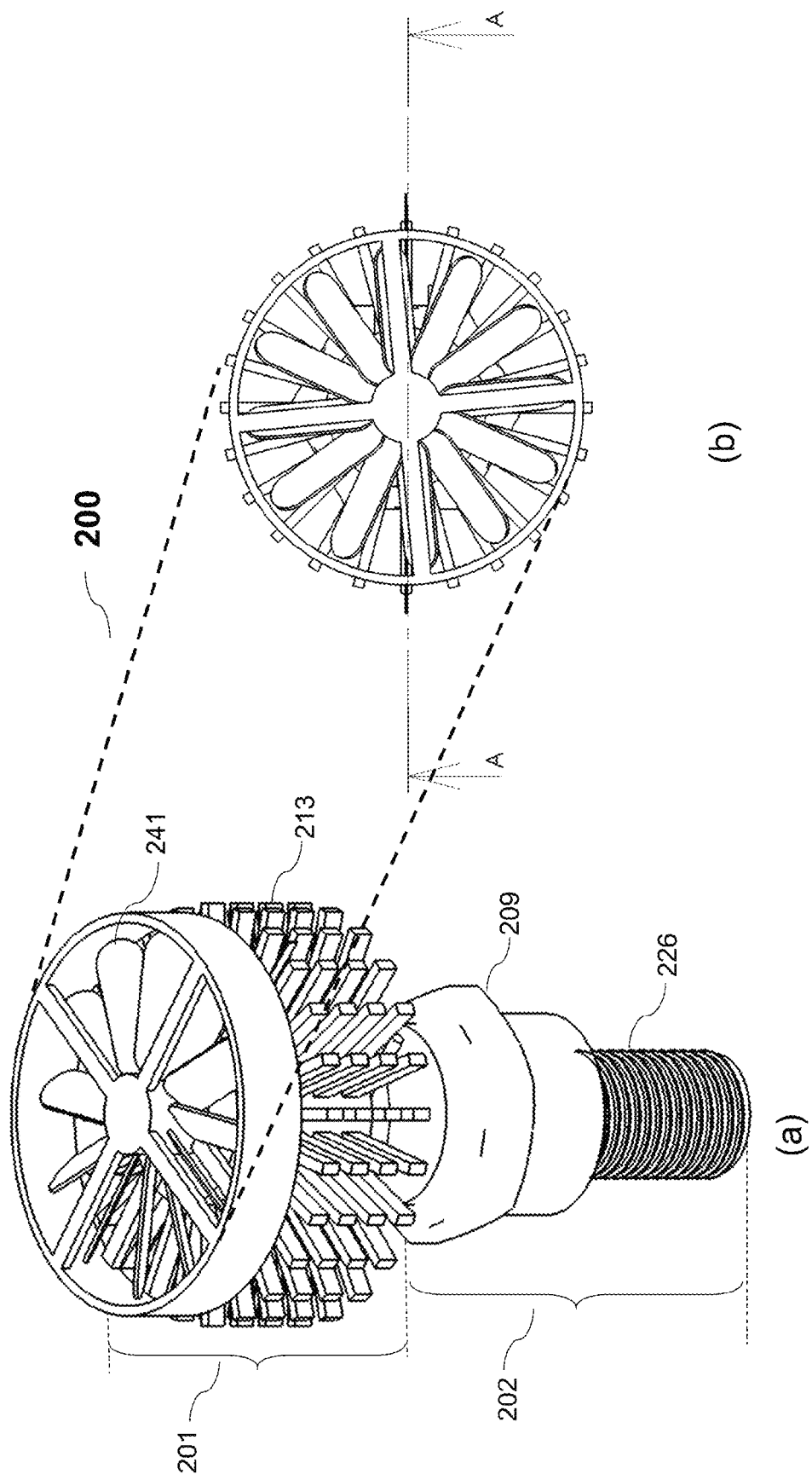
FIG. 2 is a schematic drawing of a laser ignition device assembly; a) perspective view and b) plan view of the top end.

In one preferred embodiment of the invention shown in FIG. 2, the basic elongated housing structure of the laser ignition device shown in FIG. 1 is modified to include heat transfer/dissipation means. More specifically, FIGS. 2a and 2b respectively show a perspective view and the top end view of an ignition device constructed according to this invention. In this embodiment the elongated housing may be conceived to have a lower section 202 (in reference to the drawing figure); the exterior of which lower section includes a nut 209 and a threaded section 226. An upper section 201 of the elongated housing includes a plurality of thin solid rods 213 (fins hereinafter) projected radially outwards from the external surface. The interiors of the upper and lower sections have cavities that align (at the interface) to create a contiguous hollow space for mounting optical components (optical pump, solid state laser, etc.) on respective submounts such that the respective submounts are in good thermal contact with the exterior walls to facilitate heat transfer from active elements of the ignition device via the elongated housing walls and fins. Details of the interior parts of the elongated housing will be described later.

The upper and lower sections (201 and 202) are aligned and bonded rigidly to have good mechanical strength and thermal contact to withstand mechanical, vibrational and thermal stresses experienced in a harsh operating environment of a combustion chamber. The threaded section (226) of the elongated housing is attached to a threaded cavity in the combustion chamber wall in substantially similar fashion described earlier in reference with FIG. 1a. The fins (213) provide a large surface area interface to the surrounding air to transfer/exchange/dissipate heat more effectively. In the preferred embodiment a fan 241 is provided for better air circulation and more efficient cooling (hence fin and fan cooled). However, depending upon the application environment the fan is entirely optional in some embodiments. It will be evident from later description of other embodiments, that a two-section construction as disclosed above is advantageous in matching different lower and upper sections in different adaptations for example, to apply a different cooling apparatus, for incorporating a side-pumped solid state laser, to shorten the total height etc.

Figure 3:
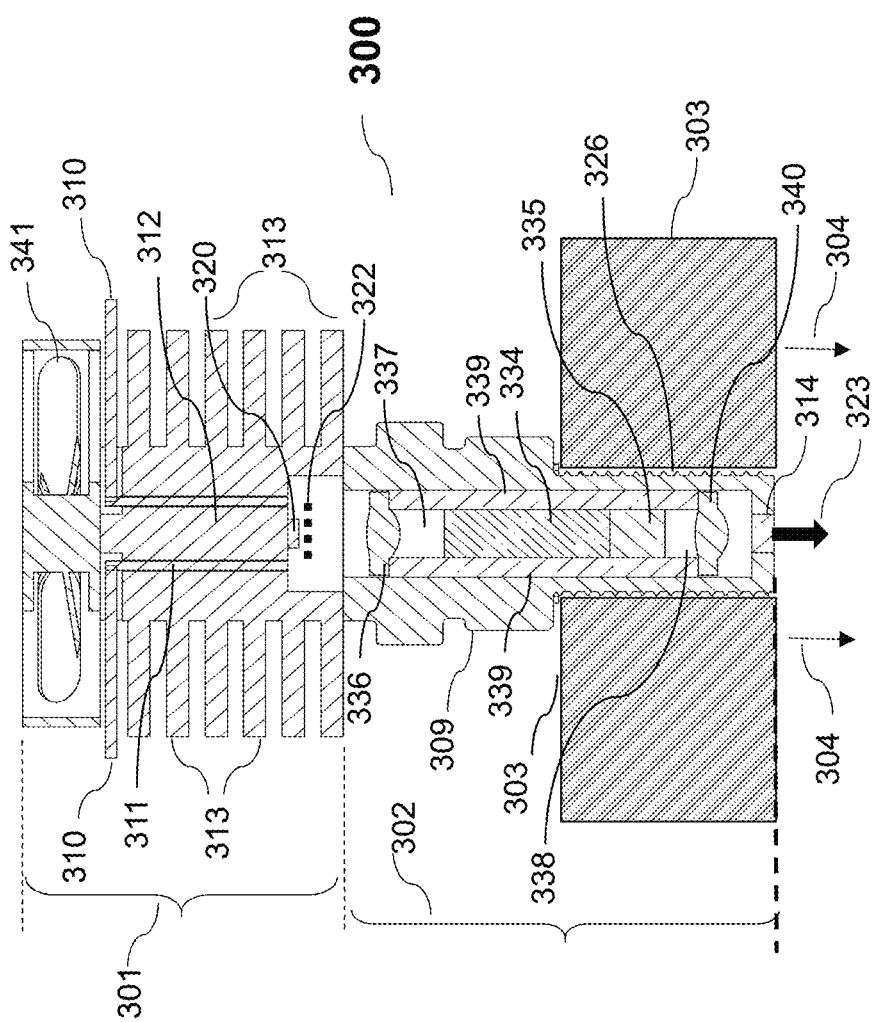
FIG. 3 shows a cross section projection of an end-pumped laser ignition device using an optical pump configured using a surface emitting laser.
Figure 4:
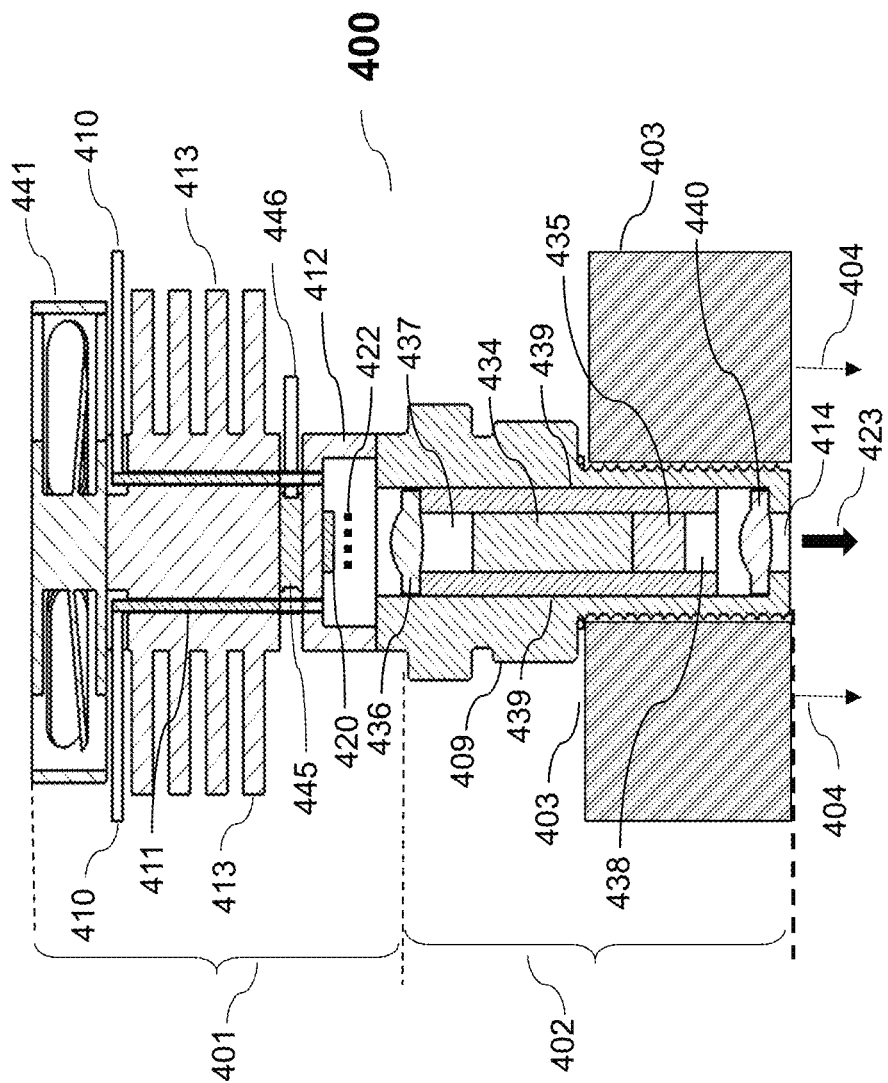
FIG. 4 shows a cross section projection of an end-pumped laser ignition device using an optical pump configured using a surface emitting laser.

The internal structure of the elongated housing is schematically shown in FIGS. 3 and 4. More specifically, FIGS. 3 and 4 show a cross section view of the elongated housing projected along the length of the laser ignition device across the line AA shown in FIG. 2b. The two embodiments are substantially similar, except for minor differences in respective cooling apparatuses. The elements labeled with similar reference numerals provide similar functionalities in both the embodiments and same description applies, unless stated otherwise. Therefore, for ease and brevity, the embodiments will be described referring to FIG. 3 in most instances with an understanding that it applies to FIG. 4 as well.

Referring now to FIGS. 3 and 4, the ignition device (300 or 400) comprises an elongated housing including rigidly bonded (hollow) lower and upper sections (302 and 301, respectively). The exterior of the lower section 302 includes a threaded portion 326 and a nut 309 to attach the elongated housing to a threaded cavity in the wall 303 of an ignition chamber 304 as has been described earlier in reference with FIG. 1a. The upper section 301 comprises a thermally conducting internal core region 312 (or a heat sink) and a plurality of fins 313 projecting outwards from the external surface of the upper section. The core region further includes electrically insulating feedthroughs 311 (only one shown for clarity) that enclose electrical connections to operate the ignition device using the external electrical terminals 310 (shown collectively, may include several electrical connections for different purposes). A fan unit 341 is attached to the top end of the upper section of the elongated housing for additional air circulation through the fins.

The hollow lower section of the elongated housing includes an ignition laser in a thermally conducting enclosure (jacket or a mount) 339 that functions as a heat dissipation means by providing thermal contact between the ignition laser via the lower section (302), the heat sink (312) and the fins (313). The ignition laser comprises a rigid rod 334 of a solid state gain medium and an optional Q-switching medium 335 bonded or attached to the gain medium. A dual multilayer dielectric high reflectivity (HR) mirror coating 337 is applied to one surface of the gain medium (top surface in FIG. 3). A partially reflecting output coupling (OC) mirror coating 338 is deposited on the opposite (lower) surface on the Q-switching medium. The HR and OC mirrors form the resonant cavity of the ignition laser.

The gain medium is optically pumped using pump light from an optical pump module through the HR coating end (end-pumping scheme). The HR mirror while being highly reflective for the ignition laser emission wavelength is transparent to pump light wavelength. The pump module includes one or more semiconductor lasers or laser arrays (edge or surface emitting) bonded to a thermally conducting submount (not shown separately for clarity). The submount is in thermal contact with the heat sink (312) and the fins (313) for cooling the pump module. The pump module is operated using the external electrical connections (310). The pump module may be operated in different modes (Continuous Wave (CW), Quasi Continuous Wave (QCW) and pulsed) thereby generating ignition laser output pulses with varying intensity, duration and interval. In one embodiment, multiple pulses are generated by controlling the optical pumping mode.

Detailed structure of optical pump modules and in particular, a VCSEL pump module and different pumping schemes for operating a solid state laser are described in the U.S. Pat. No. 8,576,885 issued on Nov. 5, 2013, to van Leeuwen et al., co-owned by Princeton Optronics Inc. Mercerville, N.J., also the assignee of this application. That description is being incorporated by reference in its entirety. Intensity, duration and interval of ignition pulses generated in the ignition laser is controlled by electrically controlling the operation of the pump module through the external electrical connections (310). Multiple laser ignition pulses are generated by applying long pump pulses to the gain medium and with appropriate transmission of the Q-switch. The continuing long pump pulse regenerates the gain after each Q-switched pulse generating multiple Q-switched pulses.

Additional one or more optical elements 322 (microlens array for example), 336 and 340 are included for providing beam shaping and beam steering functions. For example, in one exemplary embodiment of the invention the brightness of a VCSEL pump beam is enhanced by a microlens array placed downstream from the pump beam. The pump beam is focused by the optical element 336 through the HR mirror (337) and coupled to the gain medium (334). The optical element may be a single aspheric lens or a compound/complex optical system including multiple lenses and/or beam steering devices to provide a pump beam profile that better matches the profile of the ignition laser beam in the gain medium, for optimum pumping of the gain medium.

The output from the ignition laser is transmitted through the OC mirror (338) and an optical element 340 to focus the ignition laser emission to a focused beam 323 into the combustion chamber (304). The optical element may be a single spherical or aspheric lens or a compound/complex optical systems including multiple lenses and/or beam steering element to direct the ignition laser beam in a desired one or more locations in the combustion chamber. An output window 314 allows the ignition laser beam to propagate into the combustion chamber while sealing the laser assembly from the pressure and products of combustion. The window 314 is transparent to the emission wavelength and separates the ignition laser and the pump module from the harsh environment of the combustion chamber. The window material may include but is not limited to, sapphire, quartz, glass, etc. In some embodiments the beam shaping and/or steering optics 340 may function as the window.

Referring now to the variant embodiment shown in FIG. 4, in addition to the fins and fans a thermoelectric cooling (TEC) device 445 is included for more accurate and controlled thermal management. The cold temperature side of the TEC is bonded to the heat sink 412 for cooling the optical pump module 420 as well as the ignition laser 434. The high temperature side of the TEC is bonded to the cooling fins 413 to remove/dissipate heat from the TEC. The TEC is operated and controlled via electrical leads 446

(shown collectively). A temperature sensor located near the optical pump module or the ignition laser is used for controlling the TEC operation and maintain the desired temperature. The thermoelectric cooling device may also be used for stabilizing the emission wavelength of the pump module, in case the pump module comprises an edge emitting semiconductor laser(s).

Figure 5:
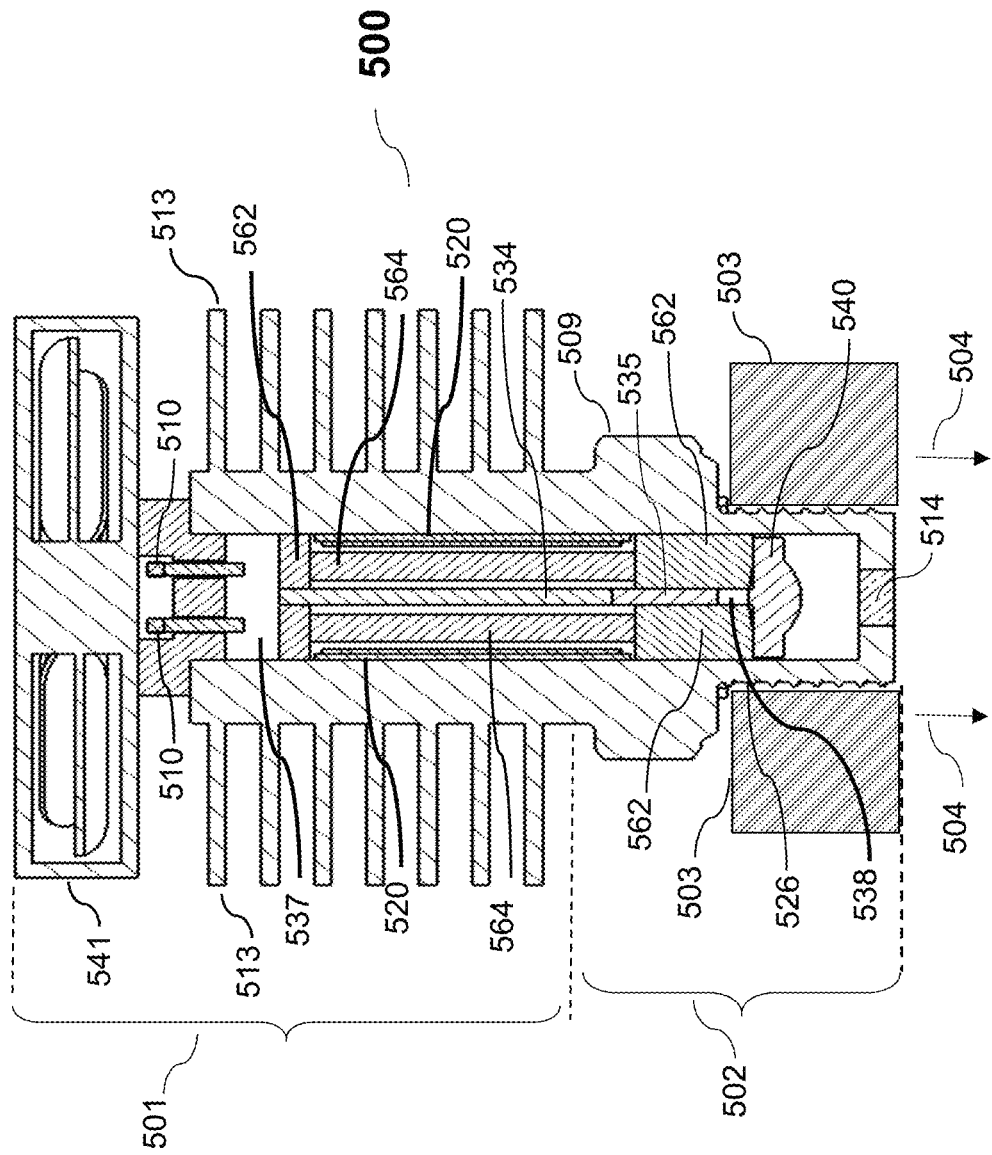
FIG. 5 shows a cross section projection of a side-pumped laser ignition device using an optical pump configured using an array of surface emitting lasers.

In a variant embodiment shown in FIG. 5, a side-pumped configuration of an ignition device broadly resembles the end-pump configurations shown in FIGS. 3 and 4 in many respects and similar reference numerals are used to label identical parts or parts providing similar functions. The general description of each of those identical parts described in reference with FIGS. 3 and 4 applies to FIG. 5 as well. The description that is common to configurations shown in FIGS. 3, 4 and 5 will not be repeated. A detailed description of side-pumped solid state laser is also disclosed in the U.S. Pat. No. 8,576,885 issued on Nov. 5, 2013, to van Leeuwen et al., co-owned by Princeton Optronics Inc. Mercerville, N.J., also the assignee of this application. That description is being incorporated by reference in its entirety.

Referring simultaneously to FIGS. 3, 4 and 5, a cross section view projected along the length of a side-pumped ignition device 500, shown in FIG. 5 differs from the end-pumped configuration (shown in FIGS. 3 and 4) in the arrangement of optical pump modules. More specifically, the gain medium and the Q-switching medium (534 and 535, respectively) and the optical pump module 520 (one on either side of the gain medium in this particular configuration) are positioned along the length of the gain medium in a single enclosure 562 that acts as the heat sink and in thermal contact with the cooling fins (513). The pump module in general are mounted on thermal submount (not shown) for efficient heat dissipation. The ignition laser cavity is set up between the HR mirror coating 537 and the OC mirror coating 538, respectively, substantially similar to the end-pumped ignition laser.

Optical elements 564, preferably cylindrical lenses are placed on both sides between the pump module and the gain medium along the length of the gain medium for shaping the pump beam profile to match the ignition laser beam profile for optimum pumping of the gain medium. The cylindrical lenses in this configuration replace the optical element(s) 336 shown in FIG. 3. It should be noted that other optical elements that can result in a desired pump beam profile are not precluded. It is further noted that while the ignition laser is pumped from the sides, the output beam from the ignition laser is emitted along the linear axis of the ignition laser through the window 514.

Prior to emission into the combustion chamber (504) through the window 514, the laser beam is further shaped by an optical element 540. Intensity, duration and interval of ignition pulses generated in the ignition laser is controlled by electrically controlling the operation of the pump module through the external electrical connections (510). Multiple laser ignition pulses are generated by applying long pump pulses to the gain medium and with appropriate transmission of the Q-switch. The continuing long pump pulse regenerates the gain after each Q-switched pulse, generating multiple Q-switched pulses.

Figure 6:
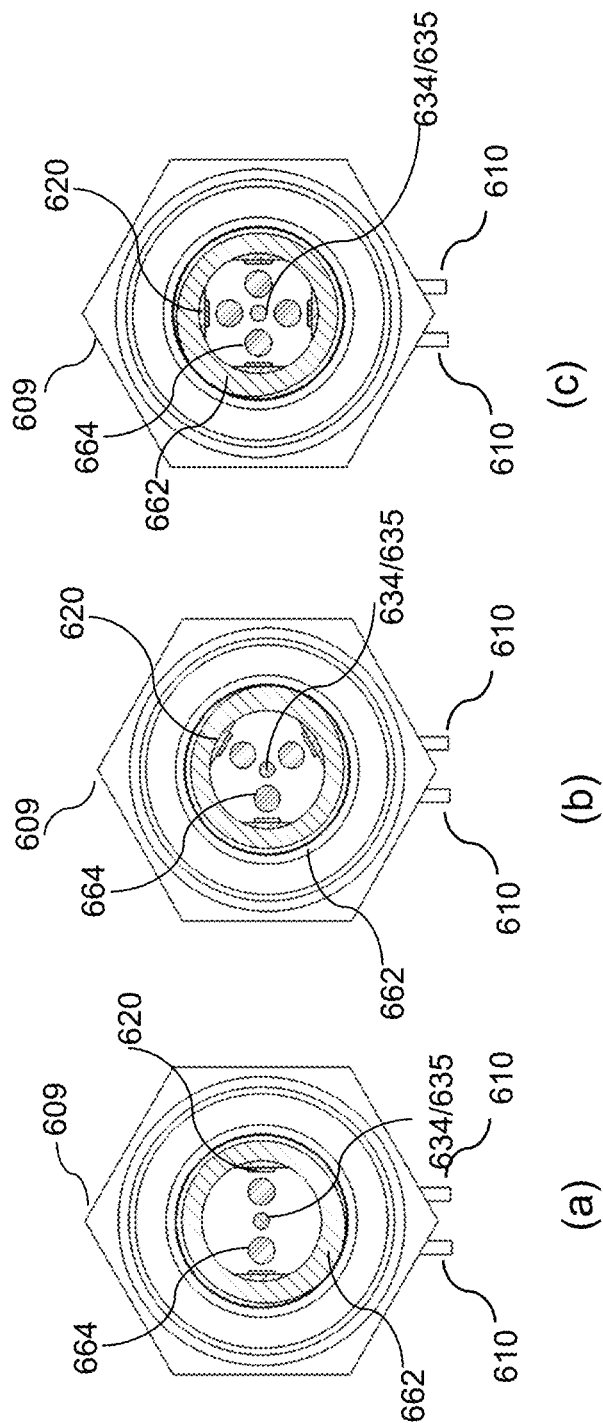
FIG. 6 shows a cross section view of a side-pumped laser ignition device depicting; a) two-, b) three- and c) four-sided optical pumping using surface emitting laser array, respectively.

One advantage of side-pumped configuration is that a more uniform and efficient optical pumping of the ignition laser is achieved. In fact, side pumping is not limited to two-side pumping as shown in FIG. 5; additional optical pump modules may be applied. FIG. 6 shows different side-pumping configurations. The reference numerals have the same general meaning described earlier in reference with FIGS. 3, 4 and 5. More specifically, FIGS. 6a, 6b and 6c show end views (viewing from the combustion chamber side and the bottom end of the ignition device shown in FIG. 5) depicting optical pump modules applied on 2, 3 and 4 sides, respectively. Overall optical pumping uniformity and therefore efficiency is improved by multiple side pumping. Another advantage of multiple side-pumping is that a larger diameter gain medium may be used to achieve a desired optical output power in a shorter length of the ignition laser, thereby reducing the vertical height of the ignition device which may be desirable in certain applications.

In the most preferred mode of operation the optical pump module comprises a VCSEL device or a VCSEL array chip. The VCSELs that may be configured in high power arrays include self-emitting two-reflector, extended cavity with integrated third reflector and extended cavity with external third reflector options. High power VCSELs and VCSEL array chips are described in U.S. Pat. No. 8,824,519 issued on Sep. 2, 2014 to Seurin et al., U.S. Pat. No. 8,675,706 issued on Mar. 18, 2014, to Seurin et al., U.S. Pat. No. 8,929,407 issued on Jan. 6, 2015, to Seurin et al., U.S. Pat. No. 9,268,012 issued on Feb. 23, 2016, to Ghosh et al., co-authored by some of the inventors of this application, and co-owned by Princeton Optronics Inc. Mercerville, N.J., also the Assignee of this application. The description of high power configurations of VCSEL device and modules in the above referenced patents is being incorporated by reference in its entirety herein. However, other semiconductor lasers and in particular edge-emitting semiconductor lasers including a single laser, a linear array or laser bar or a stacked two dimensional array are not precluded from being configured in an optical pump module in variant embodiments.

Figure 7:
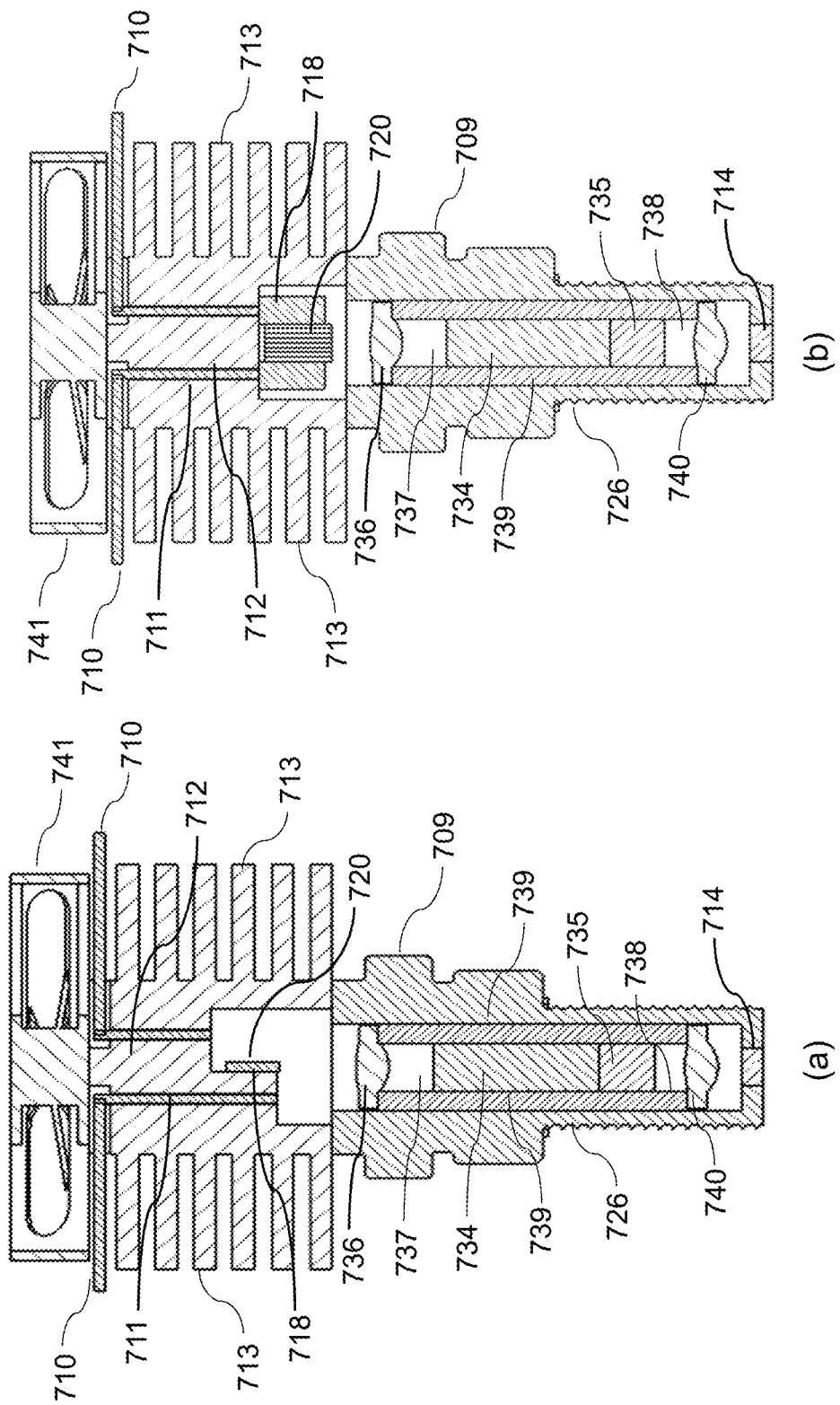
FIG. 7 shows a cross section projection of an end-pumped laser ignition device with an optical pump module configured with an edge-emitting laser, a) a single laser, and b) an array stack of lasers, respectively.
Figure 8:
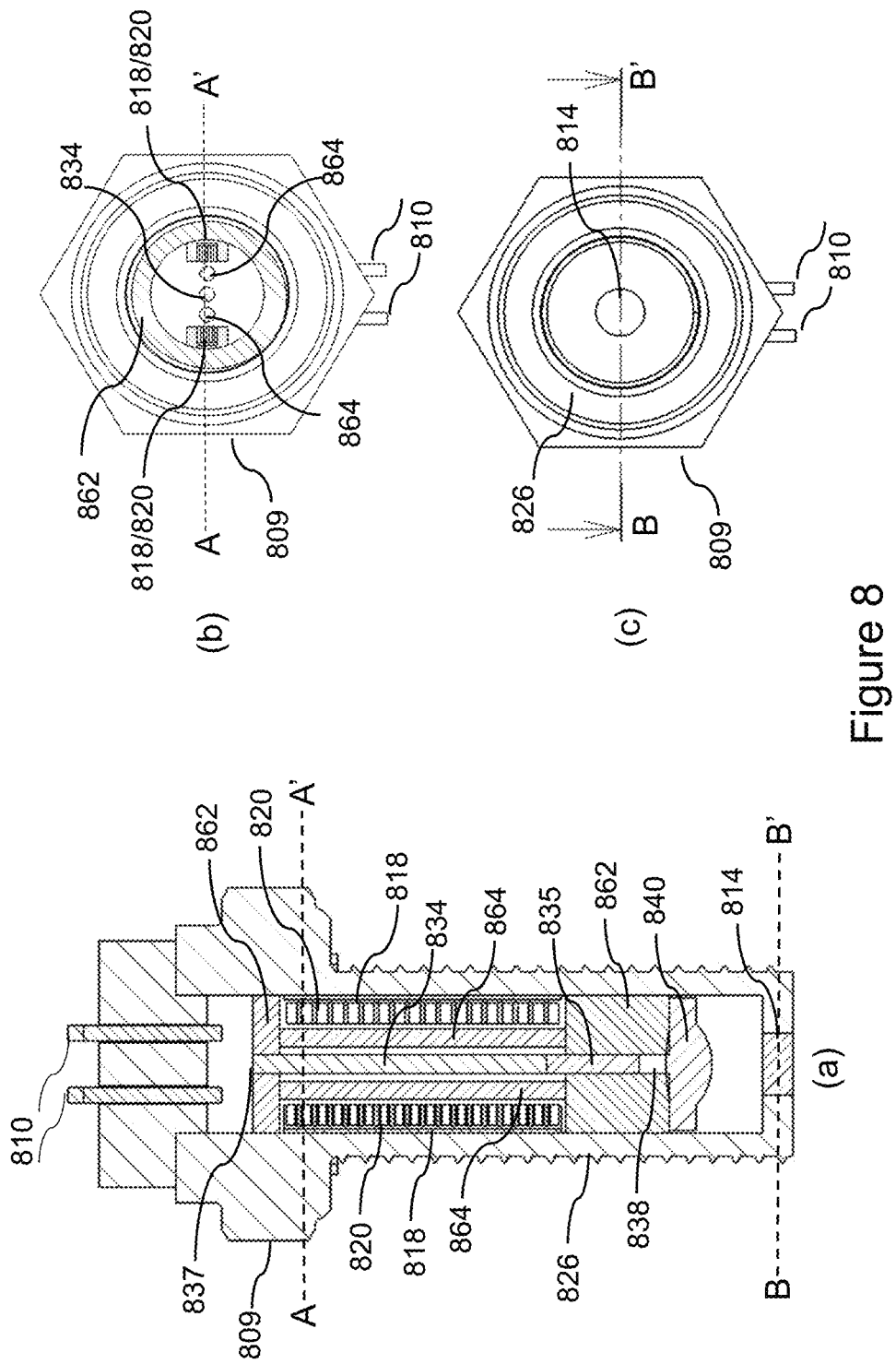
FIG. 8 is a schematic representation of a laser ignition device optically pumped by an array of edge-emitting semiconductor lasers configured in side pumping mode, a) cross section projection, b) in-plane cross section at position AA', and c) in-plane cross section at position BB', respectively.

Several exemplary embodiments of laser ignition device including edge-emitting semiconductor lasers for optically pumping an ignition laser in end-pumping and side-pumping modes are shown in FIGS. 7 and 8, respectively. More specifically, the basic structure of the ignition device shown in FIGS. 7a and 7b is substantially similar to the end-pumped ignition device shown in FIG. 3 except that the combustion chamber is not shown in FIGS. 7a and 7b. The description of individual elements in reference to FIG. 3 applies to the elements having similar reference numerals in FIGS. 7a and 7b, and that description will not be repeated. Only the parts that are different will be described.

In particular, the ignition laser gain medium (734+735) is end-pumped by a pump module configured using an edge-emitting semiconductor laser 720 in the embodiment shown in FIG. 7a. The pump module laser is mounted on a submount 718 that is in thermal contact with the heat sink 712. In this configuration the edge emitting semiconductor laser may be a single device or a linear array. In the variant embodiment shown in FIG. 7b, the optical pump module 720 is configured using a stack of edge-emitting semiconductor lasers to form an array for higher pump power. The entire stack of lasers is mounted on a submount 718 that is in thermal contact with the heat sink 712. The heat sink is thermal contact with a plurality of fins (713) and is cooled by a fan assembly 741 similar to the one described in reference with FIG. 3.

The output beam of an edge-emitting semiconductor laser is in general elliptical. Therefore, the beam shaping element 736 is selected appropriately for example, an asymmetrical lens (or lens system), such that the pump beam incident on the multilayer dielectric high reflecting (HR) mirror coating 837 of the ignition laser is focused into a circular beam to match the pump beam profile to that of the ignition laser beam profile in the gain medium for optimum pumping of the gain medium. Intensity, duration and interval of ignition pulses generated in the ignition laser is controlled by electrically controlling the operation of the pump module through the external electrical connections (710). Multiple laser ignition pulses are generated by applying long pump pulses to the gain medium and with appropriate transmission of the Q-switch. The continuing long pump pulse regenerates the gain after each Q-switched pulse generating multiple Q-switched pulses.

In a variant embodiment shown in FIG. 8*a*, the optical pump module is configured in side-pumping mode to pump the ignition laser gain medium. The configuration is equivalent of the embodiment shown in FIG. 5. Description of each element in FIG. 5 is applicable to corresponding elements represented by similar reference numerals in this configuration as well. That description will not be repeated. Only the elements that are different in this embodiment will be described. More specifically, in this particular example, the ignition laser gain medium (834+835) is optically pumped from two sides using two arrays of edge-emitting semiconductor lasers 820 mounted on respective submounts 818. The submounts are in thermal contact with the heat sink 862. The optical element(s) 864 positioned between the pump modules and the ignition laser gain medium for beam shaping is asymmetric, such that the pump beam profile is matched to the ignition laser beam profile in the gain medium for optimal pumping of the gain medium.

The device structure may be better understood by end view cross sections shown in FIGS. 8*b* and 8*c* of the ignition device along the length (vertical direction with respect to FIG. 8*a*) at lines AA' and BB', respectively. More specifically, the end view cross section in FIG. 8*b* shows relative locations of the edge emitter laser diode array pump modules 820 in reference with the heat sink 862, the focusing lenses 864 and the ignition laser gain medium 834. In this configuration the ignition laser gain medium in positioned between two pump modules placed diametrically opposite similar to a configuration shown in FIG. 6*a*. Other configurations with three or four pump modules similar to the ones shown in FIGS. 6*b* and 6*c* are equally applicable. The end view cross section in FIG. 8*c* (along line BB') includes the window 814 as seen up from the combustion chamber.

It is noted that while the gain medium in the ignition laser is optically pumped from the sides, the ignition laser resonant cavity is set up along the length of the gain medium between the multilayer dielectric high reflecting (FIR) mirror coating 837 and a partially reflecting output coupling (OC) mirror coating 838 deposited on the opposite end surface of the Q-switching section of the gain medium. The ignition laser and the pump module are in thermal contact with the heat sink 812 that in turn is in thermal contact with the cooling fins (not shown here) for heat dissipation from the ignition laser as well as the pump modules. To operate the laser ignition device current pulses are applied to the connections 810 to activate the pump module edge-emitting semiconductor laser diode array.

Multiple ignition laser pulses are generated by applying long pulses to pump the gain medium and with appropriate transmission of the Q-switch. The continuing long pump pulse regenerates the gain after each Q-switched pulse, generating multiple Q-switched pulses. The resulting short duration, high intensity laser pulse is focused into the combustion chamber and generates the plasma to ignite the combustion fuel vapors. Multiple pulses of different intensity and different duration are generated by applying different magnitude and length current pulses to the connections 810.

Figure 9:
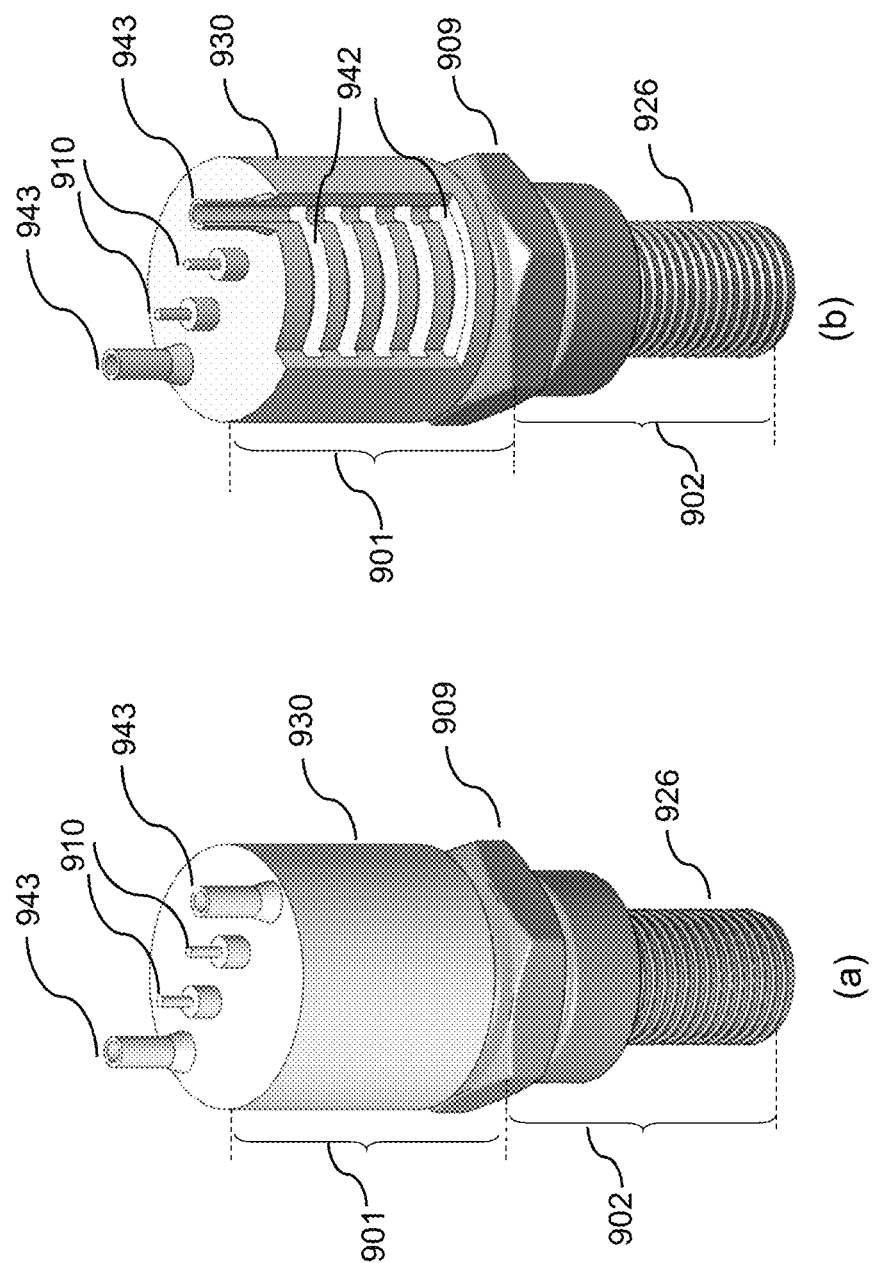
FIG. 9 shows model drawings of a liquid cooling apparatus for a laser ignition device, a) a perspective view, and b) a cut-out view showing internal construction, respectively.

Liquid Cooled Laser Ignition Device:

In combustion engine designs described in the previous section, the combustion chamber was cooled by air convection current to remove heat generated during the combustion process. In an alternative embodiment, a laser ignition device is provided with a provision for liquid cooling. The liquid cooling design is particularly suited for applications where more accurate temperature control of the laser ignition device is desired. One exemplary embodiment of a liquid cooled laser ignition device is shown in FIG. 9. More specifically, FIG. 9*a* shows an isometric exterior view and FIG. 9*b* shows the interior parts in a cut out view. The basic internal structure of the liquid cooled ignition device is similar to that of the air cooled ignition device and will be addressed later.

In particular, the exterior of the laser ignition device is an elongated housing that may be visualized to have an upper and a lower section, 901 and 902, respectively. The lower section includes a nut 909 and a threaded section 926 to attach it to a threaded cavity in a wall of a combustion chamber (please see FIGS. 1, 3, 4 and 5). The upper section (901) includes a cylindrical cooling manifold 930 that is bonded externally with the lower section (902) to provide good thermal contact between the two sections. The interior of the cooling manifold includes circulation chambers 942 shown in the cut out view in FIG. 9*b*, to allow a liquid coolant to flow between the two external ports 943 (inlet and outlet ports) located on the top surface of the cylindrical body. The liquid coolant flows through internal cooling chambers 942 along the periphery of the cylindrical structure. The top surface of the cylindrical body also includes the electrical terminals 910.

Figure 10:
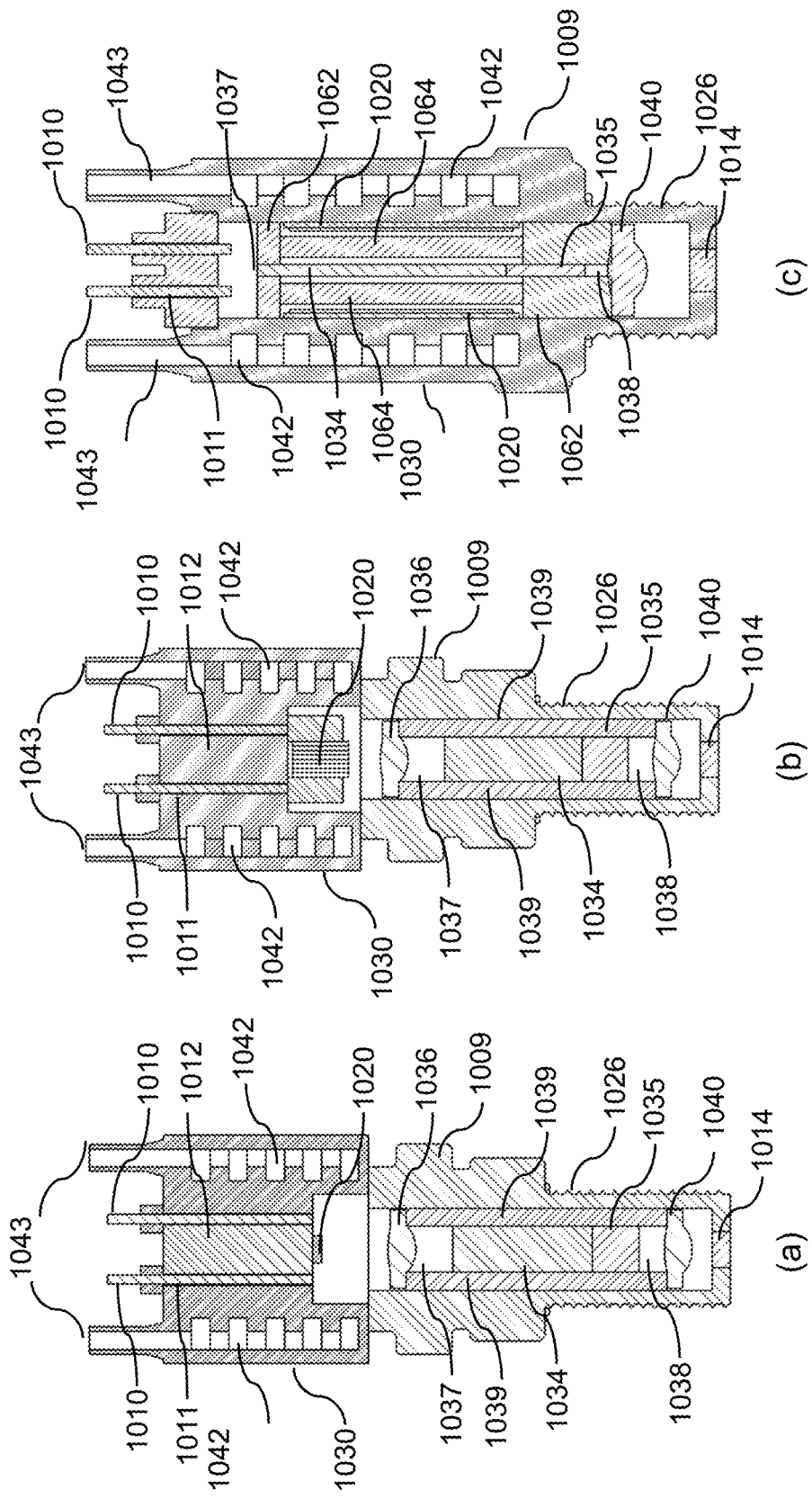
FIG. 10 shows cross section projection view of a liquid cooled laser ignition device, a) end-pumped using surface emitting lasers, b) end-pumped using edge-emitting lasers, and c) side pumped using surface emitting laser array, respectively.

Although the liquid cooling apparatus described in reference with FIG. 9 is applicable to all the embodiments shown and described earlier in reference with the air cooled embodiment shown in FIGS. 3, 4, 5, 7 and 8, only a few exemplary embodiments are shown in FIG. 10 to highlight the main design aspects. Referring now to FIGS. 3, 4, 5, 7, 8 and 9, the elements that are identical or provide similar functions, are labeled equivalently and the same description applies. Rather than repeating that description elements that are different will only be described in the following discussion. More specifically, the projection cross section views shown in FIGS. 10*a*, 10*b* and 10*c* along the length of the housing of the liquid cooled ignition device show the interior designs of the exemplary embodiments. The interior of these devices are substantially similar to the ones shown and described in FIGS. 3, 7*b*, and 5, respectively, except for the cooling apparatus.

Referring now to FIGS. 10*a* and 10*b*, the liquid cooling manifold 1030 is also in thermal contact with the heat sink (1012) and in turn to the optical pump module (1020) via the thermal submount (not shown in this view) on which the pump module is mounted. The mount or jacket (1039) that encloses the ignition laser body (1034+1035) provides a thermal contact between the ignition laser and the liquid cooling manifold 1030 via the exterior of the device (1009 and 1026). Cooling liquid enters and exits the manifold chambers 1042 through inlet and outlet ports 1043 and provides cooling to the heat sink 10121012 and the exterior of the housing 1009.

Referring now to the embodiment shown in FIG. 10*c*, the ignition laser is side pumped by the pump module (1020) located along the length of the ignition laser (1034+1035) enclosed in the submount or heat sink (1062) which is surrounded by the liquid cooling manifold 1030 all around. Therefore, cooling is more efficient. In addition, the side-pumping is in general more efficient and uniform. As a result, same output power may be generated in a shorter length of the gain medium of the ignition laser. These aspects impart certain advantages as compared to the end-pumping embodiments shown in FIGS. 10a and 10b. For example, for an equivalent output power, the ignition device size may be reduced, or alternatively, for an equivalent size, more output power may be generated. Flexibility in such design choices will be apparent to a person skilled in the art.

Figure 11:
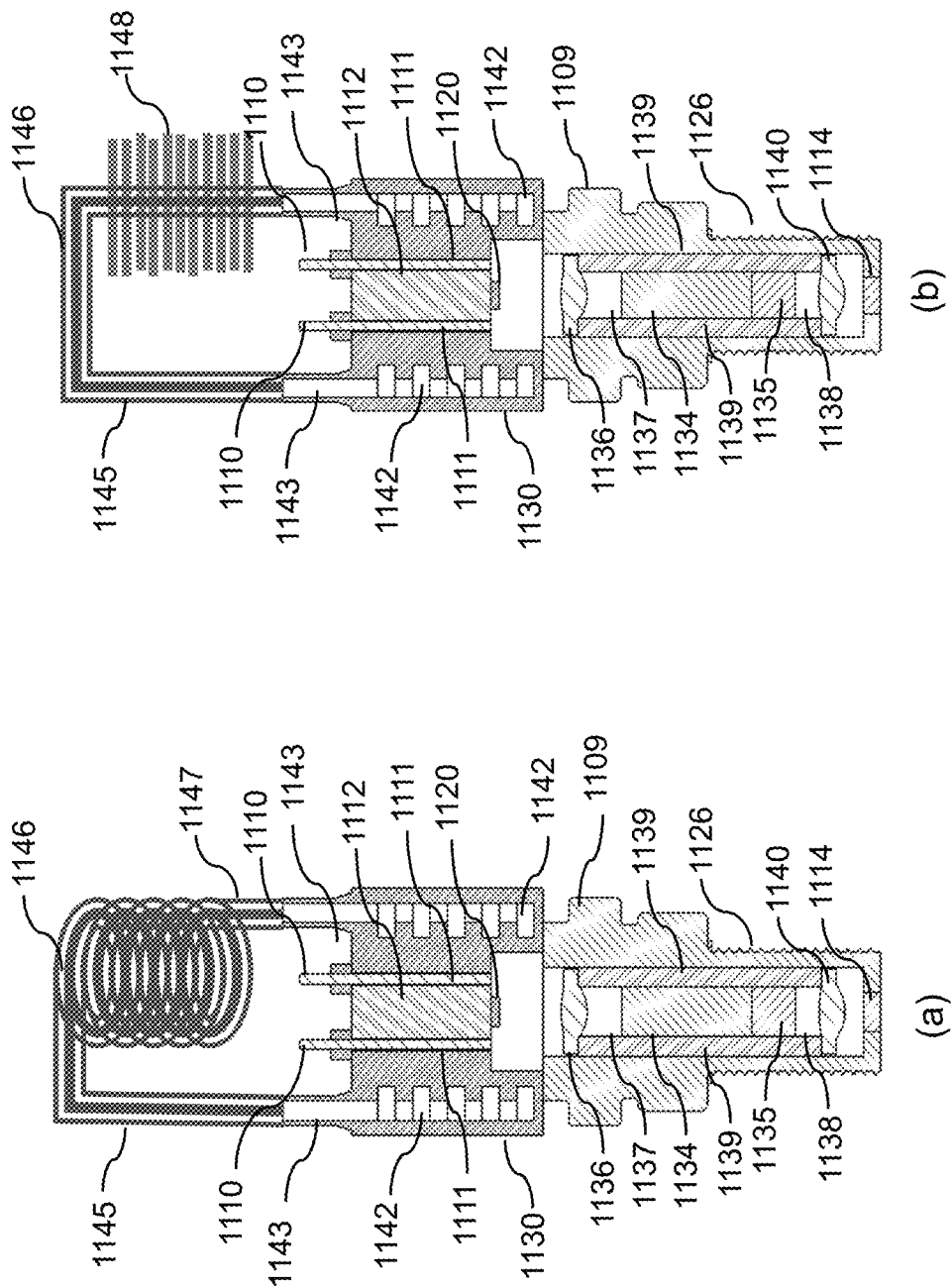
FIG. 11 schematically shows configuration for a liquid cooled apparatus configured for self-cooling using, a) cooling tube, and b) cooling fin, respectively.

The cooling liquid is typically circulated using a pump through a closed system which removes heat from the liquid in a heat exchanger and returns cooled liquid to the ignition device. This aspect is particularly advantageous for combustion chamber that uses a cooling liquid, since a single cooling system suffices. However, since the amount of heat generated by the ignition device is relatively small compared to the combustion chamber. Therefore, a separate closed cooling system is also a viable alternative. Examples of alternative closed liquid cooling apparatus applicable for the ignition device are shown in FIG. 11. The embodiments shown in FIGS. 11a and 11b are examples of alternative passive circulating liquid cooling system. In particular, the passive cooling system shown in FIG. 11a comprises a cooling tube including forward and return ends 1145 and 1147, respectively, with a cooling coil 1146 connected in between. The two ends of the cooling tube are connected to the liquid cooling manifold at the inlet and outlet ports (1143) and forms a closed path through the manifold chamber 1142.

In operation, the liquid inside the cooling manifold after being heated in the ignition device rises to enter the coil 1146 through the forward end 1145. Convection airflow over the coil removes heat from the coil thereby cooling the liquid inside. The cooled liquid then sinks down the coil and returns back through the return end 1147 back into the manifold chamber. An alternative passive cooling system is shown in FIG. 11b. Instead of a coiled section (1146 in FIG. 11a) the cooling tube is connected between the inlet and outlet ports (1143) with cooling fins 1148 attached to one side of the cooling tube. Heat from the liquid is removed by convection air flowing through the fins. Various compositions of liquids with high heat capacity may be used. In one aspect of the invention liquids that go through a phase transformation (liquid to vapor) in the operating temperature range are beneficial to increase the heat capacity through dissipation during liquid-vapor transition (using latent heat).

Figure 12:
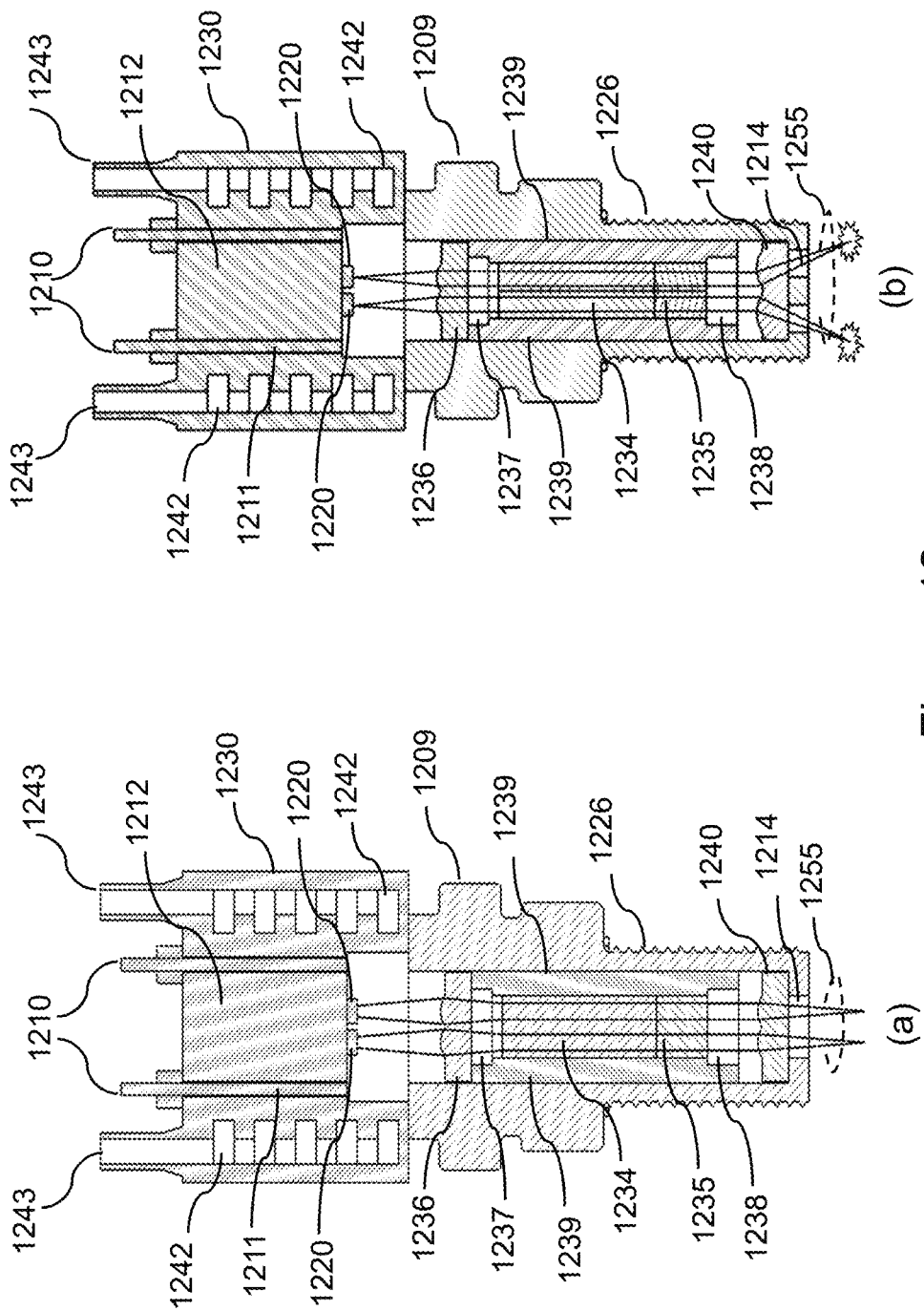
FIG. 12 schematically shows multiple beam generation using, a) multiple optical pump modules pumping a wide solid state gain medium, and b) multiple optical pump modules pumping a corresponding solid state gain media, respectively.

The efficiency of an internal combustion engine can be improved by increasing the rate of combustion so that the time from ignition to full combustion is as short as possible. One way to achieve this is to initiate combustion at multiple locations in the combustion chamber by generating multiple laser beams at different predetermined locations either simultaneously, or in a predetermined timing sequence. FIG. 12 schematically shows ignition device configurations that generates individually focused laser beams to create multiple ignition plasmas at different locations. In the variant embodiments shown in FIGS. 12a and 12b, the basic ignition device is substantially similar to the end-pumped ignition device described in reference with FIGS. 10a and 3 and each element is labeled by equivalent reference numerals for ease of discussion. For brevity, description of each element will not be repeated. However, the principles to be described shortly may be applied to other embodiments shown and described, and should not be construed to be limiting to the specific embodiments.

In particular, FIGS. 12a and 12b schematically represent two different ways of generating ignition plasmas at more than one site. In FIG. 12a a large diameter ignition laser gain medium (1234+1235) is optically pumped by using different optical pumps in the same module. In effect, it functions as multiple ignition beams. For example, multiple pump beams may be generated from an array of lasers (1220) where each element may be operated individually or simultaneously as desired by the application. Each pump beam is focused on to a separate region to generate a plurality of laser beams from a single large diameter gain medium. Optical modules that may be used as pumps for this purpose are described in many co-owned and co-authored patents referenced earlier (U.S. Pat. No. 8,824,519 issued on Sep. 2, 2014, to Seurin et al., U.S. Pat. No. 8,675,706 issued on Mar. 18, 2014, to Seurin et al., U.S. Pat. No. 8,929,407 issued on Jan. 6, 2015, to Seurin et al., U.S. Pat. No. 9,268,012 issued on Feb. 23, 2016, to Ghosh et al., co-authored by some of the inventors of this application, and co-owned by Princeton Optronics Inc. Mercerville, N.J., also the Assignee of this application).

The beam shaping optics 1236 and 1240 are selected accordingly such that pump beam from each pump source is focused on to a narrow region of the gain medium thereby pumping the gain medium in multiple sections (between the HR and OC mirrors 1237 and 1238, respectively) thereby generating multiple beams. The resulting laser beams are focused separately to different spots (collectively shown as 1255) in the combustion chamber. For example, in this particular application, an array of microlenses in which each microlens is registered with an individual element of VCSEL array is perfectly suited as beam shaping optics. In the alternative embodiment shown in FIG. 12b, a plurality of pump beams generated by a plurality of VCSELs in an array is configured to pump a respective plurality of gain media placed collectively in the laser cavity (formed between the HR and OC mirrors (1237 and 1238) to generate individual ignition beams (collectively shown as 1252). In this configuration the beam shaping optics 1236 focuses individual pump beams to a respective gain medium while the beam shaping optics at the output end is selected to deflect the output beams apart (described in U.S. patent application Ser. No. 15/055,589 filed on Apr. 24, 2016, by Chen et al. and is being incorporated by reference in its entirety).

While the general principles are described using an example of two beams, same principles may be extended to generate a desired number of ignition laser beams. It must be understood that instead of a liquid cooling manifold, the same configuration may be implemented in an air cooled ignition device. In a variant embodiment, multiple ignition beam may be generated by arranging the optical pumps in side-pumped mode to a large diameter gain medium of the ignition laser or to multiple gain media arranged in the ignition laser cavity. This variation may be best understood by the cross section shown in FIG. 13. The principles may be practiced in the basic side-pumped device shown in FIG. 5, 8 or 10c depending upon the application.

More specifically, in the side-pumped configuration shown in FIG. 13a, a large diameter gain medium (1334) is supported in the jacket or mount 1362 together with a plurality of optical pump modules including pump module and submount (1320 and 1321, respectively) and beam shaping optics (1364). For clarity, only one set on each side is labeled. Each location of the gain medium is optically pumped from two sides. Pump beams on each side of the gain medium is generated by a VCSEL device (1320) and focused by the beam shaping optics (1364) simultaneously on each location of the gain medium. In this depiction only two locations 1351 and 1352 are pumped to generate two separate ignition beams. The annular ring labeled as 1309/1326 represent the exterior body of the ignition device.

Figure 13:
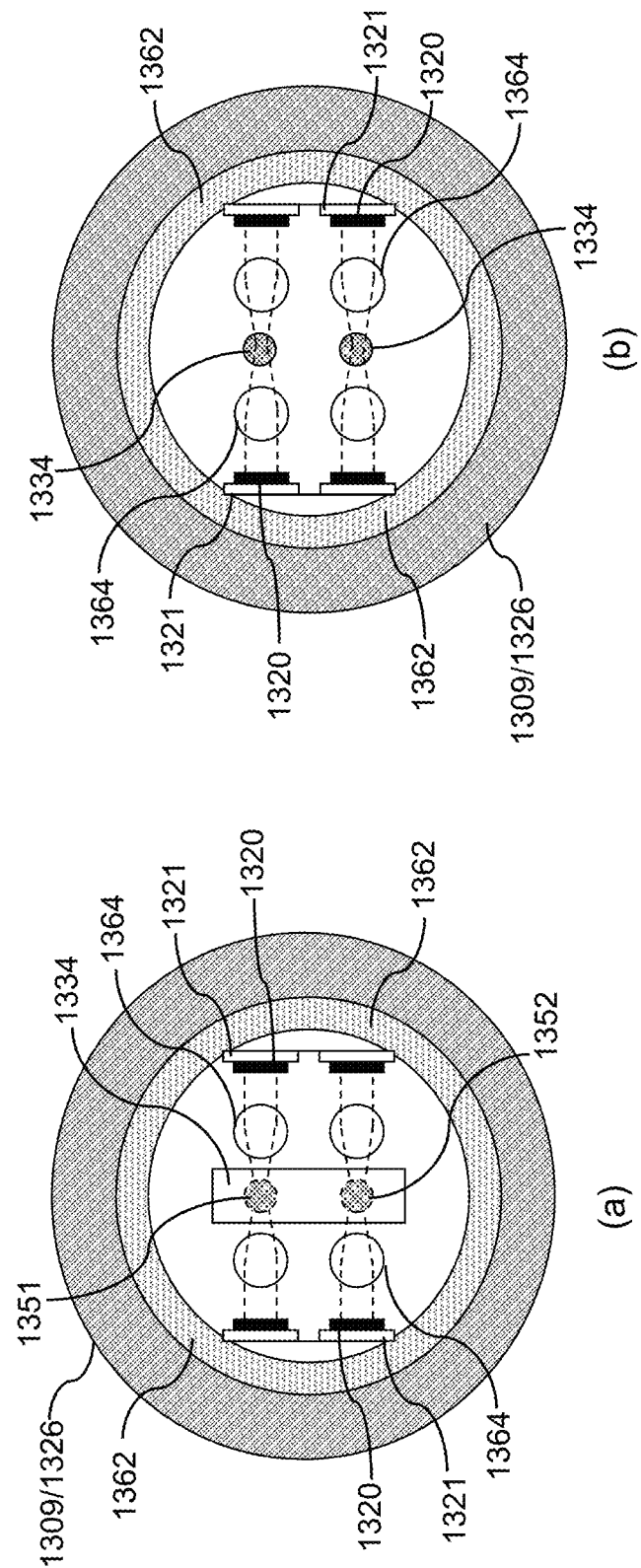
FIG. 13 represents a cross section view of interior of an optical ignition module to generate multiple output beams configured using, a) a wide solid state gain medium, and b) multiple solid state gain media, respectively.

In the alternative configuration shown in FIG. 13b, separate gain media 1334 are arranged to be pumped separately, each one from two sides as described in reference with FIG. 13a, by a set of two pump modules. It should be noted that the output optics may be arranged according to the location at which the output beam is to be directed. It is also noted that the configurations described in FIGS. 12 and 13 may be applied with air or liquid cooling apparatus (FIGS. 2 and 9, respectively). While the principle is described using two output beams, the number of output beams may be expanded depending upon the diameter of the gain medium and the number of locations the gain medium is pumped from (for example as shown in FIG. 6 of this application).

Figure 14:
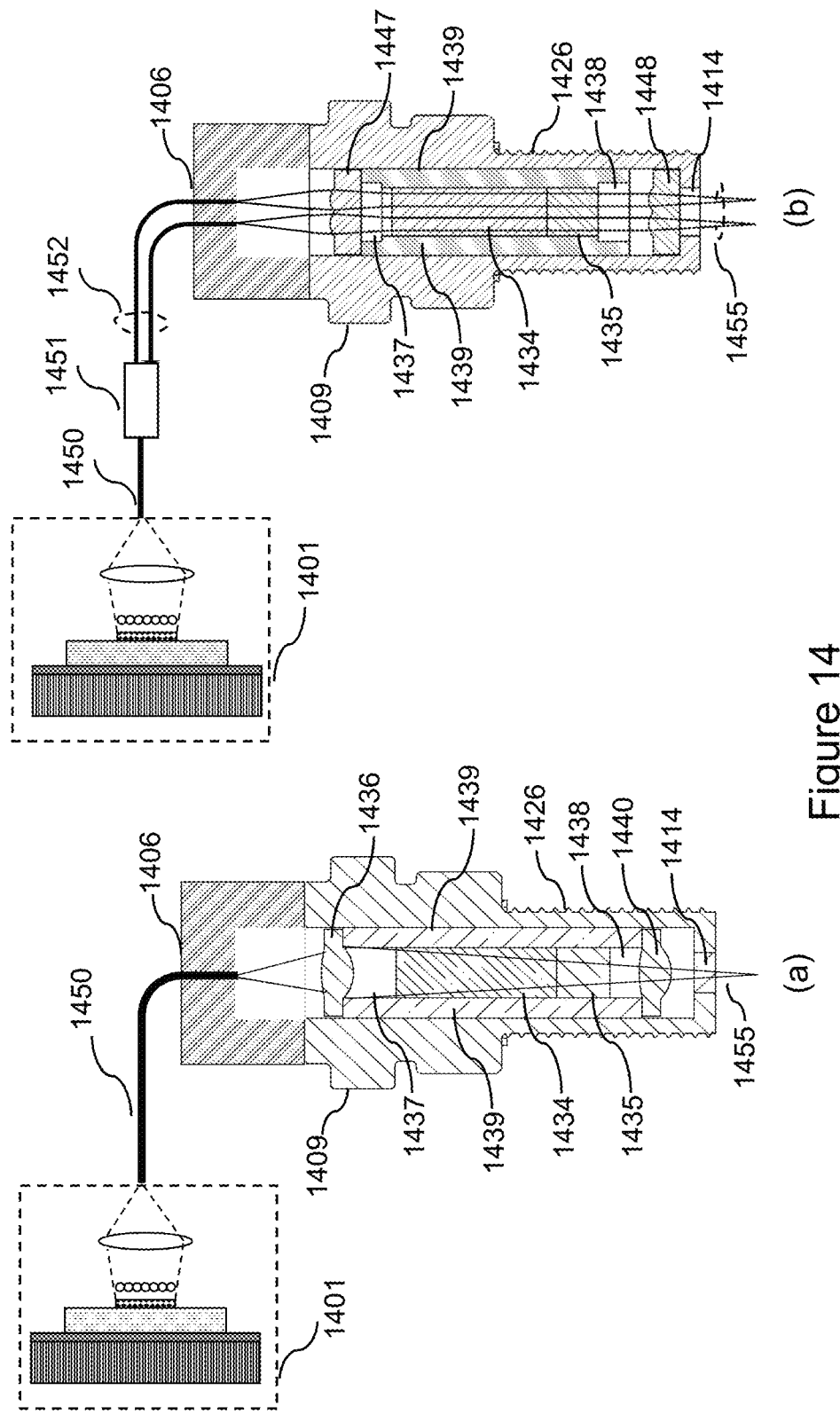
FIG. 14 is a schematic representation of a laser ignition device pumped remotely using optical fiber for generating, a) single output beam, and b) multiple output beams, respectively.

In some applications, for example, to reduce the size of the ignition device or to protect the optical pump module from the harsh environment of the combustion chamber, it is desirable to locate the optical pump module separate from the ignition laser. In an alternative embodiment shown in FIG. 14, the pump beam is transmitted over an optical fiber cable. In the exemplary embodiment shown in FIG. 14a, a single pump beam is generated and transmitted over a single fiber cable to the ignition device. The pump module shown as a block 1401 is similar to the one described in U.S. Pat. No. 8,824,519 issued on Sep. 2, 2014, to Seurin et al., and U.S. Pat. No. 8,929,407 issued on Jan. 6, 2015, to Seurin et al. That description is being incorporated by reference in its entirety.

While the example shown here does not particularly show a cooling device, either type of cooling device may be used around the exterior (1409) of the ignition device. The ignition device is attached to the combustion chamber by the threaded section (1426) as has been described earlier. In the alternative embodiment shown in FIG. 14b, a splitter 1451 is used to generate a plurality of pump beams shown collectively as 1452 (only two shown for clarity) that pump separate regions of the gain medium (1434+1435) and generate a plurality of ignition beams (shown collectively as 1455). The location of the pump beam may be arranged in a desired pattern to direct ignition beams at desired locations in the combustion chamber. It should be noted that the embodiments shown here are only exemplary to explain the basic concepts and may be expanded to generate more ignition beams. Moreover, pump beams may be generated in a pre-determined timing sequence and for different duration to support efficient and complete ignition of the fuel in the combustion chamber.

Figure 15:
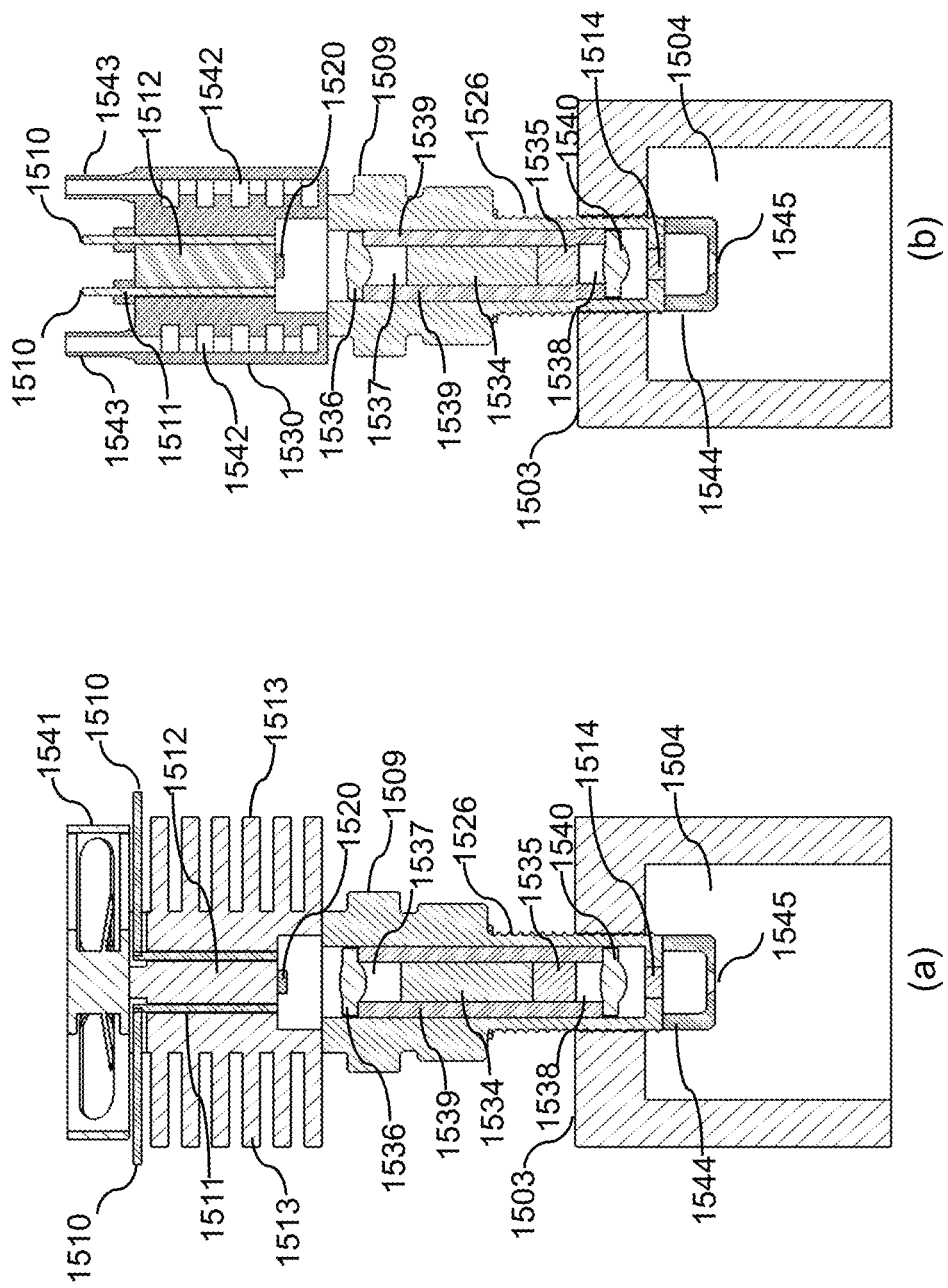
FIG. 15 schematically shows a laser ignition device configured with a baffle in, a) air cooled ignition device, and b) liquid cooled ignition device, respectively.

In a laser ignition device, a common concern is to protect the window to the ignition chamber from contamination from pre-combustion mixture as well as combustion products that deposit on the window on the side exposed to the combustion chamber. The deposits on the window attenuate and distort the laser ignition beam. As a result, the energy density of the ignition beam may be reduced to a point where it would not be sufficient to generate a plasma to ignite the combustion mixture. In one exemplary embodiment of the invention a baffle or a shield is incorporated as a protective device for the window as shown in FIG. 15.

The baffle may be incorporated in any ignition device described earlier in reference with FIGS. 3, 4, 5, 7, 10, 11, 12 and 14, although the specific examples shown in FIG. 15a and FIG. 15b to illustrate the concept are similar to the ones in FIGS. 3 and 10a, respectively. The basic device will not be described again. A baffle 1544 is attached to the bottom end of the threaded section 1526 facing the combustion chamber (1504), such that the baffle is located inside the combustion chamber. Alternatively, the baffle may be attached to the wall of the combustion chamber. The baffle has a small hole 1545 for the laser beam to transmit through. Any combustion products that penetrate through the hole are dispersed by turbulence and do not deposit on the window.

Figure 16:
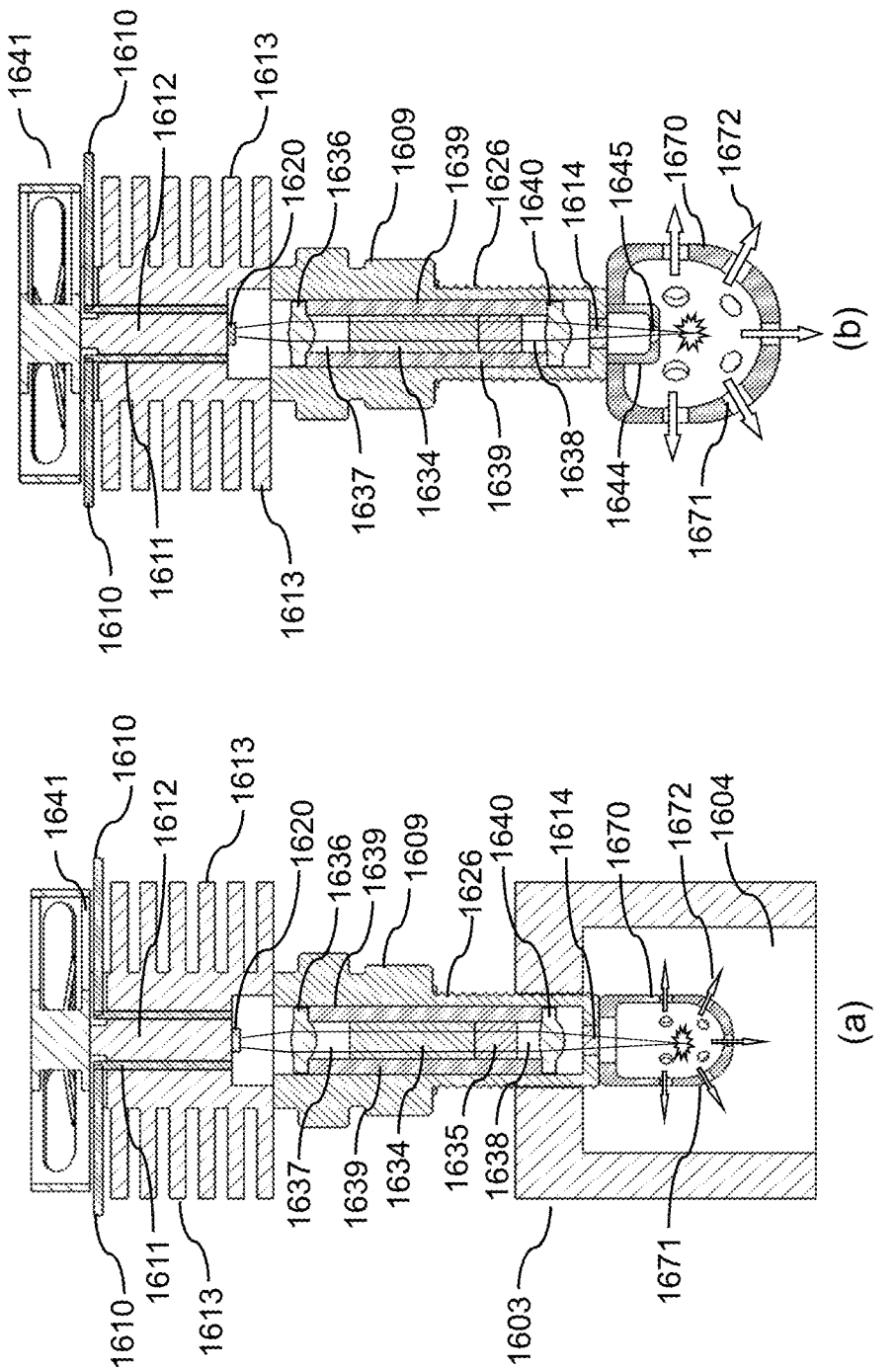
FIG. 16 schematically shows a laser ignition device configured with pre-combustion chamber, a) without baffle, and b) with baffle, respectively. prevents combustion materials depositing on the window and degrading the properties of the laser ignition beam(s).

For a more uniform and efficient combustion, a pre-combustion chamber is included in some combustion engine designs. A smaller volume of combustion materials is first ignited to create a high temperature plasma such that the ignited gases when fed into the main combustion chamber ignites a larger volume of combustion materials. One embodiment of the invention including a pre-combustion chamber is shown in FIG. 16. This feature may be applied to any of the ignition devices described so far although only a specific embodiment is cited to illustrate the concept. More specifically, a pre-combustion chamber 1670 is either attached to the lower section of the threaded section 1626 or to the wall of the combustion chamber 1604.

The pre-combustion chamber has a number of holes 1671 (only one labeled for clarity) located at the lower section of the pre-combustion chamber. The ignition laser is focused to ignite a small fraction of the combustion material in the pre-combustion chamber. Ignited gas (1672) due to expansion exits the pre-combustion chamber through holes 1671 and enter the main combustion chamber 1604 at different locations. The location of holes may be arranged, such that ignited gases enter the combustion chamber uniformly for a more uniform and efficient burning. In a variant embodiment, a pre-combustion chamber is fitted with a baffle (1644 in FIG. 16b) to protect the window.

Although the invention is described in detail with particular reference to specific embodiments that focus on different concepts of the invention in a broader sense, the invention may be practiced by incorporating elements from different embodiments into one or more preferred embodiments to accommodate other considerations such as, size of the ignition device, volume of the combustion chamber and volume and composition of the fuel/fuel mixture, output power required for complete ignition, configuration of pump module and optimum pump power to generate a required output power for ignition, the timing and duration of pumping, the cooling apparatus, etc. Variations and modifications within the broader concepts of the present invention will be apparent to those skilled in the art and it is intended to cover in the claims all such modifications and equivalents.

What is claimed is:

1. A laser ignition device comprising:
 a housing having a lower and an upper section placed in good thermal contact by bonding, wherein the exterior of the lower section comprises a threaded region to be attached to a correspondingly threaded cavity of an internal combustion engine wall, said lower and upper sections further including respective interior cavities, said cavities align to provide a contiguous hollow space, and a sealed window located at one extreme end of the lower section opposite from the upper section;
 a cooling apparatus surrounding the housing and in thermal contact with the housing;
 an optical pump module mounted on a first submount, said submount placed in thermal contact with a heat sink and a first section of the interior wall of the housing, such that the optical pump module is in thermal contact with the cooling apparatus;
 a solid state laser mounted on a second submount, said solid state laser including at least one solid gain medium disposed between a high reflectivity coating and a low reflectivity coating deposited on opposite ends of the gain medium with the low reflectivity coating end positioned to face the window, wherein said second submount is positioned in thermal contact with the heat sink and a second section of the interior wall of the housing, such that the solid state laser is in thermal contact with the cooling apparatus;

at least two beam shaping elements, wherein at least a first beam shaping element is positioned between the optical pump module and the solid state laser, and at least a second beam shaping element is positioned between the solid state laser and the window, wherein upon operating the pump module, a laser beam generated in the solid state laser is directed to a desired location to ignite a combustion fuel in the internal combustion engine.

2. The laser ignition device as in claim 1, wherein the optical pump module includes one or more semiconductor lasers.

3. The laser ignition device as in claim 2, wherein the optical pump module includes VCSEL devices including VCSEL arrays, and wherein VCSEL devices are one selected from a group consisting of a self-emitting two-reflector VCSEL, an extended cavity integrated three-reflector VCSEL and an extended cavity external three-reflector VCSEL.

4. The laser ignition device as in claim 1, wherein the at least one solid gain medium is one selected from a group consisting of ruby and Nd:YAG.

5. The laser ignition device as in claim 1, wherein the optical pump module is configured to pump the gain medium from the end having the high reflectivity coating.

6. The laser ignition device as in claim 4 wherein the optical pump module is configured to pump the gain medium from sides perpendicular to the ends that have the high reflectivity and low reflectivity coatings.

7. The laser ignition device as in claim 1, wherein the gain medium is optically pumped at more than one location to generate a plurality of laser beams that are directed to separate locations to ignite the combustion fuel at different locations in the internal combustion engine, said plurality of laser beams are generated either simultaneously or in a pre-determined timed sequence.

8. The laser ignition device as in claim 1, wherein the solid state laser includes more than one gain media that are optically pumped separately to generate a plurality of laser beams that are directed to separate locations to ignite the combustion fuel at different locations in the internal combustion engine, said plurality of laser beams are generated either simultaneously or in a pre-determined timed sequence.

9. The laser ignition device as in claim 1, wherein the beam shaping elements provide function that is one selected from a group consisting of collimating, focusing, diverging and beam steering.

10. The laser ignition device as in claim 7, wherein the beam shaping elements include single lens or complex lens systems configured using one or more of symmetric lenses, asymmetric lenses, microlens or microlens arrays.

11. The laser ignition device as in claim 1, wherein the cooling apparatus includes a plurality of fins projected outwards from an external surface of the upper section of the housing, said fins providing extended surface area for cooling by air convection.

12. The laser ignition device as in claim 9, wherein an optional fan is provided to facilitate cooling by air convention.

13. The laser ignition device as in claim 1, wherein the cooling apparatus includes a liquid cooling manifold having cooling chambers with inlet and outlet ports.

14. The laser ignition device as in claim 13, wherein a cooling liquid is pumped through the cooling manifold.

15. The laser ignition device as in claim 13 further including a cooling coil connected between the inlet and outlet ports for passive liquid cooling.

16. The laser ignition device as in claim 13 further including cooling fins attached to a cooling tube connected between the inlet and outlet ports for dissipating heat from the cooling liquid to facilitate passive liquid cooling.

17. The laser ignition device as in claim 15, wherein the cooling liquid undergoes a phase transformation to facilitate the cooling process by utilizing the latent heat of the cooling liquid.

18. The laser ignition device as in claim 1 further including a baffle attached to the window end of the housing to protect the window from deposits from the combustion process.

19. The laser ignition device as in claim 1, wherein a pre-combustion chamber is included at the window end of the housing, said pre-combustion chamber extending into the combustion chamber.

20. The laser ignition device as in claim 1, wherein the solid state laser is operated in Q-switching mode to generate a very high power output pulse or multiple high power output pulses, and wherein intensity, duration and interval of output pulses is controlled by operating conditions of the optical pump module.

* * * * *